US008455349B2

(12) United States Patent
Sasaki et al.

(10) Patent No.: US 8,455,349 B2
(45) Date of Patent: Jun. 4, 2013

(54) LAYERED CHIP PACKAGE AND METHOD OF MANUFACTURING SAME

(75) Inventors: Yoshitaka Sasaki, Milpitas, CA (US); Hiroyuki Ito, Milpitas, CA (US); Atsushi Iijima, Hong Kong (CN); Tatsuya Harada, Tokyo (JP)

(73) Assignees: Headway Technologies, Inc., Milpitas, AZ (US); SAE Magnetics (H.K.) Ltd., Hong Kong (CN); TDK Corporation, Tokyo (JP)

( * ) Notice: Subject to any disclaimer, the term of this patent is extended or adjusted under 35 U.S.C. 154(b) by 270 days.

(21) Appl. No.: 12/769,361

(22) Filed: Apr. 28, 2010

(65) Prior Publication Data

US 2011/0266692 A1 Nov. 3, 2011

(51) Int. Cl.
*H01L 21/4763* (2006.01)

(52) U.S. Cl.
USPC .......... 438/629; 438/637; 438/667; 257/774; 257/777

(58) Field of Classification Search
USPC .... 257/774–77, 774–777, E21.614; 438/455, 438/620, 622, 629–713
See application file for complete search history.

(56) References Cited

U.S. PATENT DOCUMENTS

| | | | | |
|---|---|---|---|---|
| 6,566,232 B1 * | 5/2003 | Hara et al. | ..................... | 438/455 |
| 2001/0008794 A1 * | 7/2001 | Akagawa | ..................... | 438/620 |
| 2003/0073299 A1 * | 4/2003 | Mashino | ..................... | 438/597 |
| 2004/0192029 A1 * | 9/2004 | Hartwell | ..................... | 438/637 |
| 2007/0218678 A1 * | 9/2007 | Suh et al. | ..................... | 438/622 |
| 2008/0179728 A1 | 7/2008 | Ikeda | | |
| 2008/0230923 A1 * | 9/2008 | Jo et al. | ..................... | 257/777 |
| 2008/0318361 A1 * | 12/2008 | Han et al. | ..................... | 438/109 |
| 2009/0075478 A1 * | 3/2009 | Matsui | ..................... | 438/667 |

FOREIGN PATENT DOCUMENTS

JP   A-2003-163324   6/2003
JP   A-2008-187061   8/2008

OTHER PUBLICATIONS

U.S. Appl. No. 12/692,270, filed Jan. 22, 2010; in the name of Sasaki et al.

* cited by examiner

*Primary Examiner* — Eugene Lee
*Assistant Examiner* — Fang-Xing Jiang
(74) *Attorney, Agent, or Firm* — Oliff & Berridge, PLC

(57) ABSTRACT

A layered chip package includes a main body and a plurality of through electrodes. The main body includes a plurality of layer portions stacked and a plurality of through holes that penetrate all the plurality of layer portions. The plurality of through electrodes are provided in the plurality of through holes of the main body and penetrate all the plurality of layer portions. Each of the plurality of layer portions includes a semiconductor chip. At least one of the plurality of layer portions includes wiring that electrically connects the semiconductor chip to the plurality of through electrodes. The wiring includes a plurality of conductors that make contact with a through electrode that is exposed in the wall faces of any one of the plurality of through holes and passes through the through hole.

10 Claims, 23 Drawing Sheets

LAYERED CHIP PACKAGE AND METHOD OF MANUFACTURING SAME

BACKGROUND OF THE INVENTION

1. Field of the Invention

The present invention relates to a layered chip package that includes a plurality of semiconductor chips stacked, a method of manufacturing the same, and a substructure for use in manufacturing the layered chip package.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

U.S. Patent Application Publication No. US 2008/0179728 A1 describes a laminated memory formed using the through electrode method.

JP-A-2003-163324 describes a three-dimensional laminated semiconductor device in which a plurality of chips stacked are wired by using wiring plugs that are similar to through electrodes. The three-dimensional laminated semiconductor device includes a stack of a plurality of unit semiconductor devices. Each single unit semiconductor device includes a semiconductor chip having a chip electrode, a wiring pattern, molding resin, and wiring plugs. The chip electrode is mounted on one surface of the wiring pattern. The molding resin covers the semiconductor chip and the wiring pattern. The wiring plugs penetrate the molding resin outside the semiconductor chip. The wiring plugs each have one end in contact with the one surface of the wiring pattern, and the other end exposed from the molding resin. The other surface of the wiring pattern is exposed in the surface of the molding resin. In the three-dimensional laminated semiconductor device, the wiring plugs of the lower one of two unit semiconductor devices are put into contact with the exposed surface of the wiring pattern of the upper one of the two unit semiconductor devices, whereby the plurality of semiconductor chips are wired together.

The wire bonding method has the problem that it is difficult to reduce the distance between the electrodes so as to avoid contact between the wires, and the problem that the high resistances of the wires hamper quick circuit operation.

The through electrode method is free from the above-mentioned problems of the wire bonding method. Unfortunately, however, the conventional through electrode method requires a large number of steps for forming the through electrodes in chips, and consequently increases the cost for the layered chip package. According to the conventional through electrode method, forming the through electrodes in chips requires a series of steps as follows: forming a plurality of holes for the plurality of through electrodes in a wafer that is to be cut later into a plurality of chips; forming an insulating layer and a seed layer in the plurality of holes and on the top surface of the wafer; filling the plurality of holes with metal such as Cu by plating to form the through electrodes; and removing unwanted portions of the seed layer.

As with the foregoing problem with the conventional through electrode method, the three-dimensional laminated semiconductor device described in JP-A-2003-163324 requires a large number of steps for forming the wiring plugs, which leads to the problem of increased cost.

OBJECT AND SUMMARY OF THE INVENTION

It is an object of the present invention to provide a layered chip package that includes a plurality of semiconductor chips stacked, a method of manufacturing the same, and a substructure for use in manufacturing the layered chip package that make it possible to mass-produce the layered chip package at low cost in a short time.

A layered chip package of the present invention includes a main body and a plurality of through electrodes. The main body includes a plurality of layer portions stacked and a plurality of through holes that penetrate all the plurality of layer portions. The plurality of through electrodes are provided in the plurality of through holes of the main body and penetrate all the plurality of layer portions. Each of the plurality of layer portions includes a semiconductor chip. At least one of the plurality of layer portions includes wiring that electrically connects the semiconductor chip to the plurality of through electrodes.

In the layered chip package of the present invention, the wiring may include a plurality of conductors that are electrically connected to the plurality of through electrodes. The plurality of conductors may have their respective end faces that appear in wall faces of the plurality of through holes and make contact with outer surfaces of the through electrodes. In such a case, the plurality of conductors may have their respective electrode pass holes for the plurality of through electrodes to be passed through. Wall faces of the electrode pass holes may constitute the foregoing end faces.

In the layered chip package of the present invention, each of the plurality of layer portions may include a plurality of insulator fill holes that are formed to penetrate the semiconductor chip, and insulating layers that are made of an insulator and fill the respective insulator fill holes. The plurality of through holes may penetrate the insulating layers of the plurality of layer portions. In such a case, the insulator may contain resin as its main component. The insulator may further contain insulating grains mixed with the resin.

In the layered chip package of the present invention, the plurality of layer portions may include at least one first-type layer portion and at least one second-type layer portion. The semiconductor chip of the first-type layer portion is a normally functioning one, whereas the semiconductor chip of the second-type layer portion is a malfunctioning one. The first-type layer portion includes the wiring, whereas the second-type layer portion does not include the wiring.

In the layered chip package of the present invention, each of the plurality of layer portions may include an insulating layer formed around the semiconductor chip. The plurality of through holes may penetrate the insulating layers of the plurality of layer portions.

A method of manufacturing the layered chip package of the present invention includes the steps of: fabricating a substructure that includes at least one main-body-forming portion which is a portion to be the main body, the main-body-forming portion including the plurality of layer portions and the plurality of through holes without the plurality of through electrodes; and forming the plurality of through electrodes in the plurality of through holes in the main-body-forming portion of the substructure.

In the method of manufacturing the layered chip package of the present invention, the substructure may include, as the at least one main-body-forming portion, a plurality of main-body-forming portions that are arranged in a direction orthogonal to the stacking direction of the plurality of layer portions. In such a case, the method of manufacturing the layered chip package may further include the step of separating the plurality of main-body-forming portions from each other into a plurality of main bodies after the step of forming the plurality of through electrodes.

In the method of manufacturing the layered chip package of the present invention, the plurality of through electrodes may be formed by plating.

In the method of manufacturing the layered chip package of the present invention, the wiring may include a plurality of conductors that are electrically connected to the plurality of through electrodes. The plurality of conductors may have their respective end faces that appear in wall faces of the plurality of through holes and make contact with outer surfaces of the through electrodes. In such a case, the plurality of conductors may have their respective electrode pass holes for the plurality of through electrodes to be passed through. Wall faces of the electrode pass holes may constitute the foregoing end faces.

In the method of manufacturing the layered chip package of the present invention, the step of fabricating the substructure may include the steps of: fabricating an initial substructure that is intended to undergo the formation of the plurality of through holes therein later to thereby become the substructure; and forming the substructure by forming the plurality of through holes in the initial substructure.

The initial substructure includes a plurality of initial layer portions which are the plurality of layer portions before the formation of the plurality of through holes. Each of the plurality of initial layer portions may include a plurality of insulator fill holes that are formed to penetrate the semiconductor chip, and insulating layers that are made of an insulator and fill the respective insulator fill holes. In such a case, in the step of forming the substructure, the plurality of through holes may be formed to penetrate the insulating layers of the plurality of initial layer portions. The insulator may contain resin as its main component. The insulator may further contain insulating grains mixed with the resin.

In the case where each of the plurality of initial layer portions includes the foregoing plurality of insulator fill holes and insulating layers, the substructure may include, as the at least one main-body-forming portion, a plurality of main-body-forming portions that are arranged in a direction orthogonal to the stacking direction of the plurality of layer portions. In such a case, the step of fabricating the initial substructure may include the steps of fabricating a plurality of chip arrays each including an array of a plurality of pre-semiconductor-chip portions, each of the plurality of pre-semiconductor-chip portions being intended to become any one of the semiconductor chips included in the main body; and forming the initial substructure by stacking the plurality of chip arrays. In such a case, the method of manufacturing the layered chip package may further include the step of separating the plurality of main-body-forming portions from each other into a plurality of main bodies after the step of forming the plurality of through electrodes.

The step of fabricating the plurality of chip arrays may include, as a series of steps for fabricating a single chip array, the steps of fabricating a pre-array wafer that has first and second surfaces facing toward opposite directions and includes an array of a plurality of pre-semiconductor-chip portions; forming a plurality of grooves in the pre-array wafer, the plurality of grooves opening in the first surface of the pre-array wafer and being intended to become the plurality of insulator fill holes later; filling the plurality of grooves with the insulator, thereby forming a pre-polishing array that has first and second surfaces corresponding to the first and second surfaces of the pre-array wafer; and polishing the pre-polishing array from its second surface until the plurality of grooves are exposed so that the plurality of grooves become the plurality of insulator fill holes.

In the case where the substructure includes a plurality of main-body-forming portions, the plurality of layer portions of at least one of the plurality of main-body-forming portions may include at least one first-type layer portion and at least one second-type layer portion. The semiconductor chip of the first-type layer portion is a normally functioning one, whereas the semiconductor chip of the second-type layer portion is a malfunctioning one. The first-type layer portion includes the wiring, whereas the second-type layer portion does not include the wiring. In such a case, the step of fabricating the plurality of chip arrays may include the steps of: distinguishing the plurality of pre-semiconductor-chip portions into normally functioning pre-semiconductor-chip portions and malfunctioning pre-semiconductor-chip portions; and forming the wiring in the normally functioning pre-semiconductor-chip portions, and not in the malfunctioning pre-semiconductor-chip portions.

In the method of manufacturing the layered chip package of the present invention, the initial substructure may include a plurality of initial layer portions which are the plurality of layer portions before the formation of the plurality of through holes. Each of the plurality of initial layer portions may include an insulating layer formed around the semiconductor chip. In such a case, in the step of forming the substructure, the plurality of through holes may be formed to penetrate the insulating layers of the plurality of initial layer portions.

A substructure of the present invention is for use in manufacturing the layered chip package. The substructure includes at least one main-body-forming portion which is a portion to be the main body. The main-body-forming portion includes the plurality of layer portions and the plurality of through holes without the plurality of through electrodes. The substructure of the present invention is to undergo the formation of the plurality of through electrodes in the plurality of through holes in the main-body-forming portion later.

The substructure of the present invention may include, as the at least one main-body-forming portion, a plurality of main-body-forming portions that are arranged in a direction orthogonal to the stacking direction of the plurality of layer portions. In such a case, the plurality of main-body-forming portions are to be separated from each other into a plurality of main bodies after the plurality of through electrodes are formed. The plurality of layer portions of at least one of the plurality of main-body-forming portions may include at least one first-type layer portion and at least one second-type layer portion. The semiconductor chip of the first-type layer portion is a normally functioning one, whereas the semiconductor chip of the second-type layer portion is a malfunctioning one. The first-type layer portion includes the wiring, whereas the second-type layer portion does not include the wiring.

In the substructure of the present invention, the wiring may include a plurality of conductors that are to be electrically connected to the plurality of through electrodes when the plurality of through electrodes are formed. The plurality of conductors may have their respective end faces that appear in wall faces of the plurality of through holes and will make contact with outer surfaces of the through electrodes. In such a case, the plurality of conductors may have their respective electrode pass holes for the plurality of through electrodes to be passed through when the plurality of through electrodes are formed. Wall faces of the electrode pass holes may constitute the foregoing end faces.

In the substructure of the present invention, each of the plurality of layer portions included in the substructure may include a plurality of insulator fill holes that are formed to penetrate the semiconductor chip, and insulating layers that are made of an insulator and fill the respective insulator fill holes. The plurality of through holes may penetrate the insulating layers of the plurality of layer portions. In such a case, the insulator may contain resin as its main component. The insulator may further contain insulating grains mixed with the resin.

In the substructure of the present invention, each of the plurality of layer portions included in the substructure may include an insulating layer formed around the semiconductor chip. The plurality of through holes may penetrate the insulating layers of the plurality of layer portions.

According to the layered chip package, the method of manufacturing the same, or the substructure of the present invention, a plurality of through electrodes that penetrate all the plurality of layer portions are formed in the plurality of through holes that penetrate all the plurality of layer portions. This makes it possible to manufacture a layered chip package having a plurality of through electrodes in a small number of steps. Consequently, according to the present invention, it is possible to mass-produce the layered chip package at low cost in a short time.

Other and further objects, features and advantages of the present invention will appear more fully from the following description.

DETAILED DESCRIPTION OF THE PREFERRED EMBODIMENTS

First Embodiment

Figure 1:
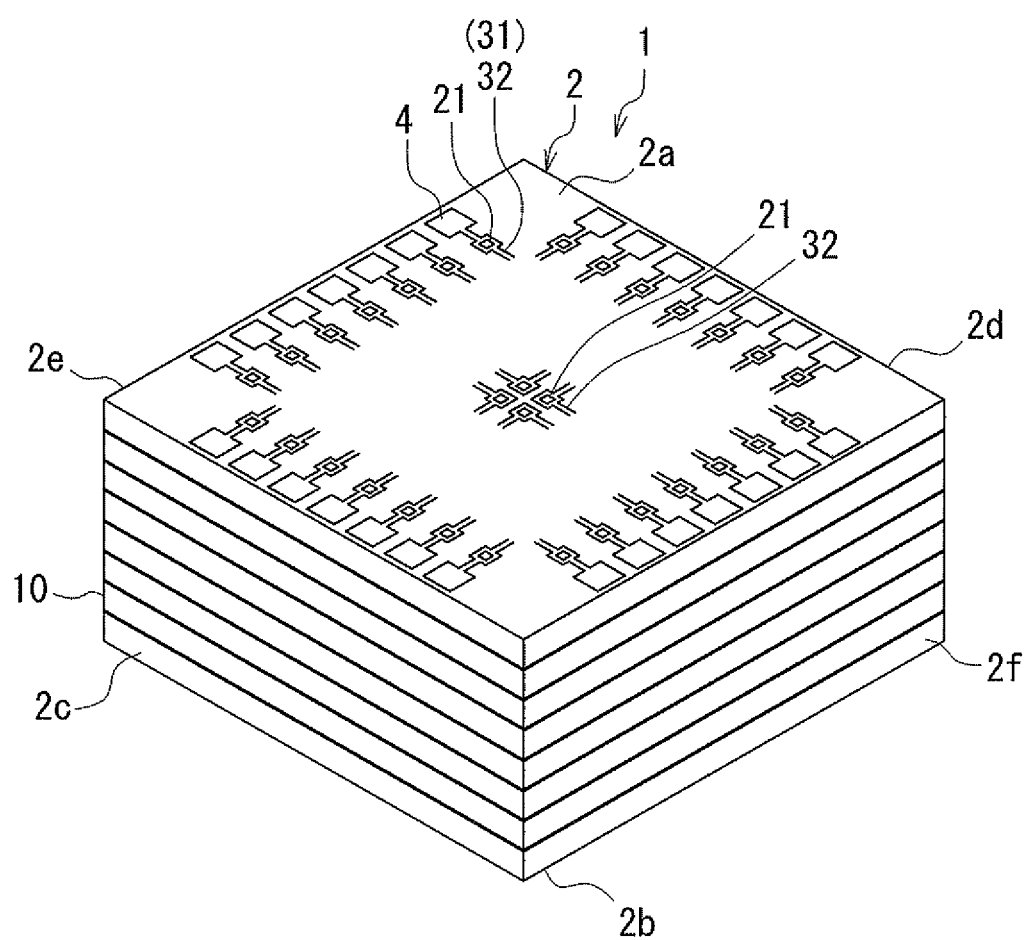
FIG. 1 is a perspective view of a layered chip package according to a first embodiment of the invention.
Figure 2:
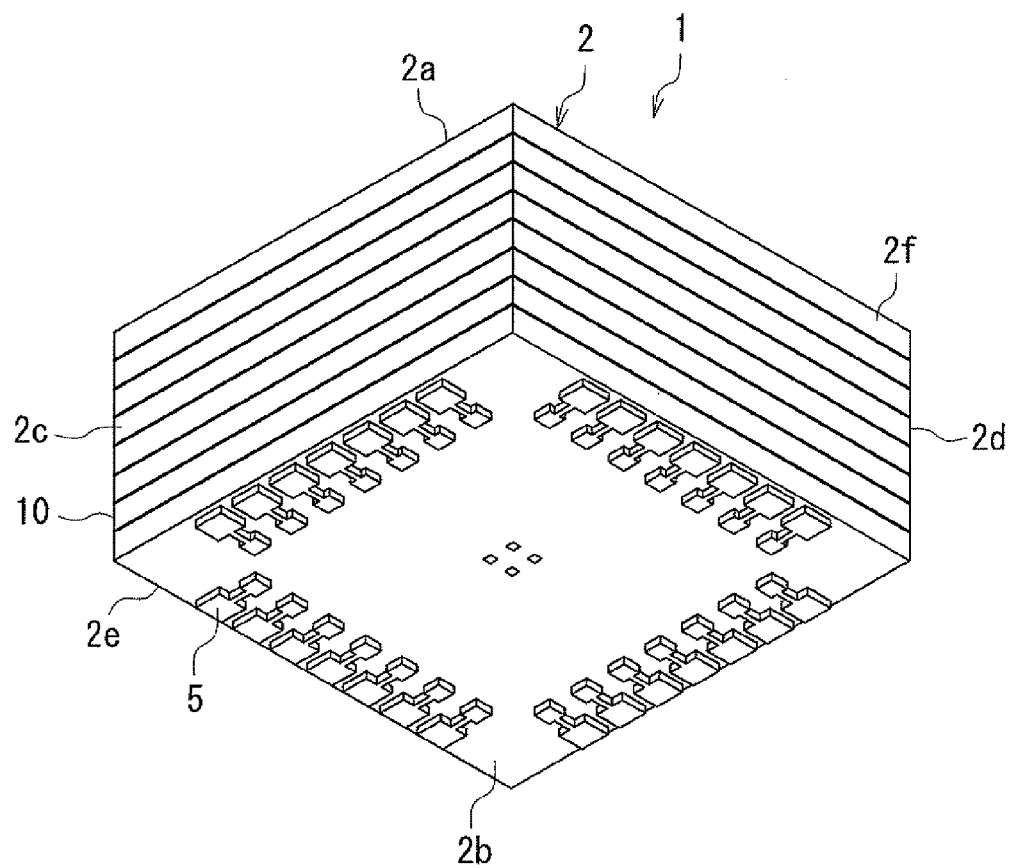
FIG. 2 is a perspective view showing the layered chip package of FIG. 1 as seen from below.
Figure 3:
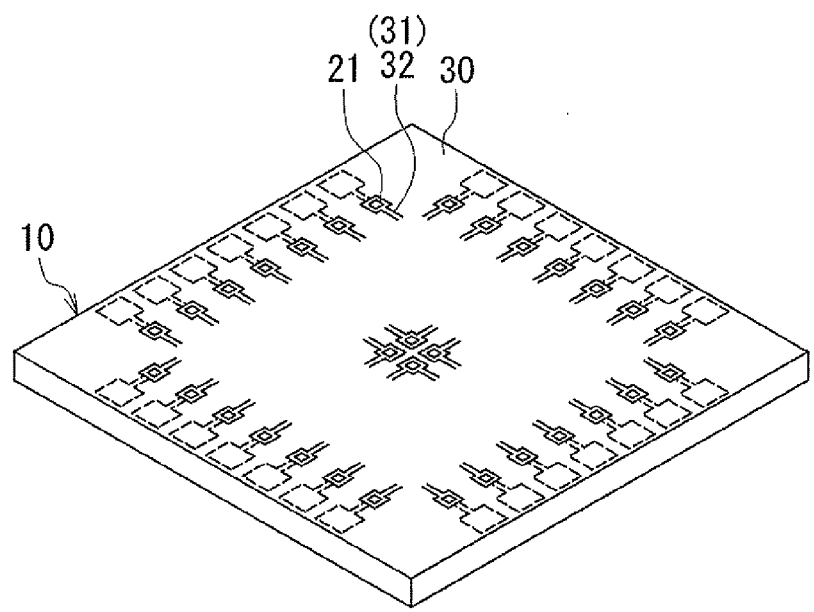
FIG. 3 is a perspective view of one of the layer portions shown in FIG. 1.
Figure 4:
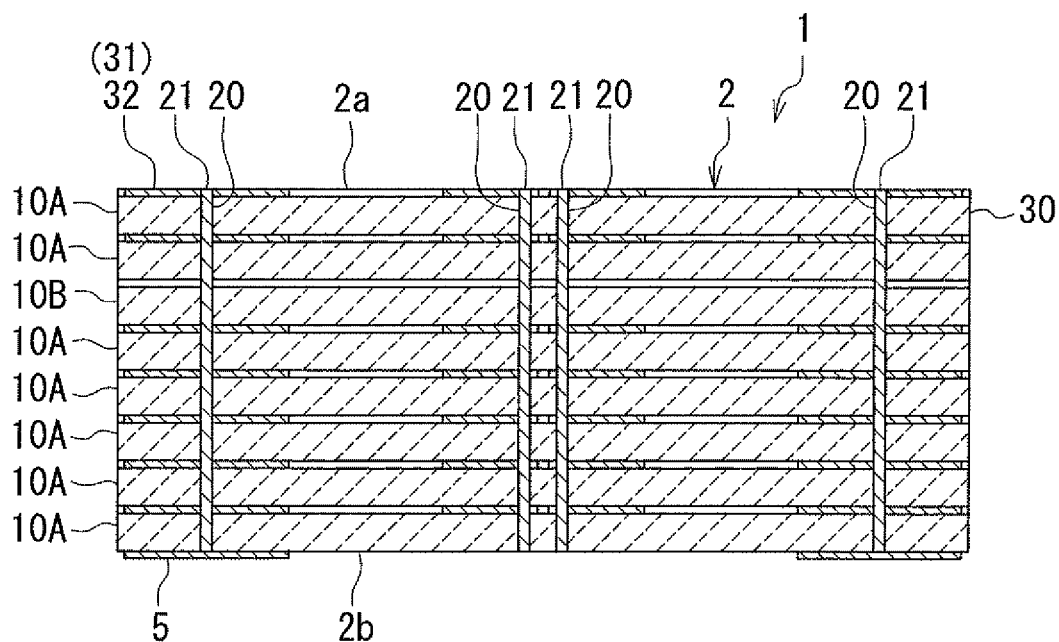
FIG. 4 is a cross-sectional view of the layered chip package shown in FIG. 1.

Preferred embodiments of the present invention will now be described in detail with reference to the drawings. First, reference is made to FIG. 1 to FIG. 4 to describe the configuration of a layered chip package according to a first embodiment of the invention. FIG. 1 is a perspective view of the layered chip package according to the present embodiment. FIG. 2 is a perspective view showing the layered chip package of FIG. 1 as seen from below. FIG. 3 is a perspective view of one of the layer portions shown in FIG. 1. FIG. 4 is a cross-sectional view of the layered chip package shown in FIG. 1.

As shown in FIG. 1, FIG. 2 and FIG. 4, the layered chip package 1 according to the present embodiment includes a main body 2 which is generally rectangular-solid-shaped. The main body 2 has a top surface 2a, a bottom surface 2b, and four side surfaces 2c, 2d, 2e, and 2f. The main body 2 includes a plurality of layer portions 10 stacked. By way of example, FIG. 1 and FIG. 2 show the case where the main body 2 includes eight layer portions 10. The number of the layer portions 10 to be included in the main body 2 is not limited to eight, and may be any plural number. Every two vertically adjacent layer portions 10 are bonded to each other with an adhesive made of an insulating resin.

The layered chip package 1 further includes a plurality of terminals 4 disposed on the top surface 2a of the main body 2, and a plurality of terminals 5 disposed on the bottom surface 2b of the main body 2. Note that the layered chip package 1 may include either one and not both of the terminals 4 and the terminals 5.

As shown in FIG. 4, the main body 2 further includes a plurality of through holes 20 that penetrate all the plurality of layer portions 10 included in the main body 2. The layered chip package 1 further includes a plurality of through electrodes 21 that are provided in the plurality of through holes 20 of the main body 2 and penetrate all the plurality of layer portions 10. The through electrodes 21 are made of Cu, Au, Ni, Cr, or Zn, for example.

As shown in FIG. 3 and FIG. 4, each of the plurality of layer portions 10 includes a semiconductor chip 30. The semiconductor chip 30 has a top surface, a bottom surface, and four side surfaces. The four side surfaces of the semiconductor chip 30 are exposed in the side surfaces 2c, 2d, 2e, and 2f of the main body 2, respectively.

Although not shown in FIG. 3 and FIG. 4, each of the plurality of layer portions 10 includes a plurality of insulator fill holes that are formed to penetrate the semiconductor chip 30, and insulating layers that are made of an insulator and fill the respective insulator fill holes. The plurality of through holes 20 penetrate the insulating layers of the plurality of layer portions 10. A detailed description of the insulator fill holes and the insulating layers will be given later.

At least one of the plurality of layer portions 10 included in the main body 2 includes wiring 31 that electrically connects the semiconductor chip 30 to the plurality of through electrodes 21. The wiring 31 includes a plurality of conductors 32 that are electrically connected to the plurality of through electrodes 21. The plurality of conductors 32 have their respective end faces that appear in the wall faces of the plurality of through holes 20 and make contact with the outer surfaces of the through electrodes 21. The conductors 21 may be made of Cu, for example.

At least another one of the plurality of layer portions 10 included in the main body 2 may be without the wiring 31. A layer portion 10 that includes the wiring 31 will hereinafter be referred to as a first-type layer portion and designated by reference numeral 10A. A layer portion 10 that does not include the wiring 31 will hereinafter be referred to as a second-type layer portion and designated by reference numeral 10B. The semiconductor chip 30 of the first-type layer portion 10A is a normally functioning one, whereas the semiconductor chip 30 of the second-type layer portion 10B is a malfunctioning one. Hereinafter, a normally functioning semiconductor chip 30 will be referred to as a conforming semiconductor chip 30, and a malfunctioning semiconductor chip 30 will be referred to as a defective semiconductor chip 30. FIG. 4 shows an example where, of the plurality of layer portions 10 included in the main body 2, the third layer portion 10 from the top is the second-type layer portion and the other seven layer portions 10 are the first-type layer portions.

If the uppermost layer portion 10 in a main body 2 is the first-type layer portion 10A, the plurality of terminals 4 may be formed of respective portions of the conductors 32 of that layer portion 10, or may be formed of other plurality of conductors that are electrically connected to the conductors 32. If the uppermost layer portion 10 in a main body 2 is the second-type layer portion 10B, the plurality of terminals 4 are formed of a plurality of conductors that are electrically connected to the top ends of the through electrodes 21 that are located in the top surface 2a of the main body 2. The plurality of terminals 5 are formed of a plurality of conductors that are electrically connected to the bottom ends of the through electrodes 21 that are located in the bottom surface 2b of the main body 2.

In FIG. 3, the portions of the plurality of conductors 32 to form the plurality of terminals 4 are shown by the broken lines. If the plurality of terminals 4 are formed of respective portions of the conductors 32 of the uppermost layer portion 10, the conductors 32 of the other layer portions 10 may or may not include the portions that are shown by the broken lines in FIG. 3.

The semiconductor chip 30 may be a memory chip that constitutes a memory such as a flash memory, DRAM, SRAM, MRAM, PROM, or FeRAM. In such a case, it is possible to implement a large-capacity memory by using the layered chip package 1 including a plurality of semiconductor chips 30. With the layered chip package 1 according to the present embodiment, it is also possible to easily implement a memory of various capacities such as 64 GB (gigabytes), 128 GB, and 256 GB, by changing the number of the semiconductor chips 30 to be included in the layered chip package 1.

In the case where the semiconductor chip 30 includes a plurality of memory cells and where one or more of the memory cells are defective, the semiconductor chip 30 is still conforming if it can function normally by employing the redundancy technique.

The semiconductor chips 30 are not limited to memory chips, and may be used for implementing other devices such as CPUs, sensors, and driving circuits for sensors. The layered chip package 1 according to the present embodiment is particularly suitable for implementing an SiP.

Figure 5:
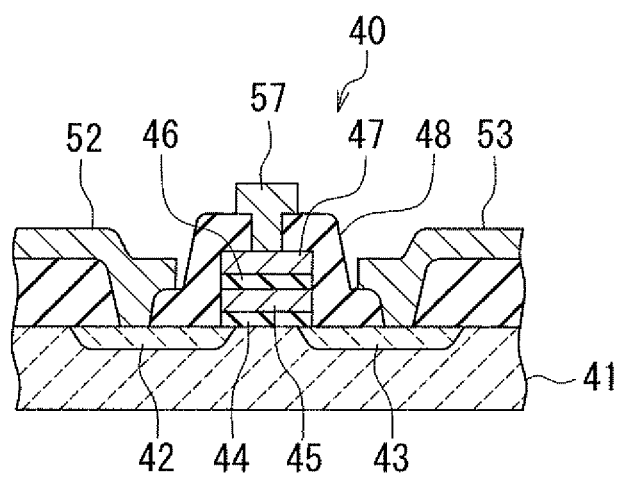
FIG. 5 is a cross-sectional view showing a part of the device included in the semiconductor chip.

Reference is now made to FIG. 5 to describe an example of device included in the semiconductor chip 30. By way of example, the following description will deal with a case where the device included in the semiconductor chip 30 is a circuit including a plurality of memory cells that constitute a memory. FIG. 5 shows one of the plurality of memory cells. The memory cell 40 includes a source 42 and a drain 43 formed near a surface of a P-type silicon substrate 41. The source 42 and the drain 43 are both N-type regions. The source 42 and the drain 43 are disposed at a predetermined distance from each other so that a channel composed of a part of the P-type silicon substrate 41 is provided between the source 42 and the drain 43. The memory cell 40 further includes an insulating film 44, a floating gate 45, an insulating film 46, and a control gate 47 that are stacked in this order on the surface of the substrate 41 at the location between the source 42 and the drain 43. The memory cell 40 further includes an insulating layer 48 that covers the source 42, the drain 43, the insulating film 44, the floating gate 45, the insulating film 46 and the control gate 47. The insulating layer 48 has contact holes that open in the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the corresponding contact holes.

Next, a description will be given of a method of manufacturing the layered chip package 1 according to the present embodiment. The method of manufacturing the layered chip package 1 includes the step of fabricating a substructure. As will be detailed later, the substructure includes at least one main-body-forming portion which is a portion to be the main body 2. The main-body-forming portion includes the plurality of layer portions 10 and the plurality of through holes 20 without the through electrodes 21. The method of manufacturing the layered chip package 1 further includes the step of forming the plurality of through electrodes 21 in the plurality of through holes 20 in the main-body-forming portion of the substructure.

The step of fabricating the substructure includes the steps of fabricating an initial substructure that is intended to undergo the formation of the plurality of through holes 20 therein later to thereby become the substructure; and forming the substructure by forming the plurality of through holes 20 in the initial substructure.

The substructure may include, as the foregoing at least one main-body-forming portion, a plurality of main-body-forming portions that are arranged in directions orthogonal to the stacking direction of the plurality of layer portions 10. In such a case, the method of manufacturing the layered chip package further includes the step of separating the plurality of main-body-forming portions from each other into a plurality of main bodies after the step of forming the plurality of through electrodes 21.

Hereinafter, the method of manufacturing the layered chip package 1 will be described in detail in conjunction with the case where the substructure includes a plurality of main-body-forming portions arranged in the directions orthogonal to the stacking direction of the plurality of layer portions 10. Initially, the step of fabricating the initial substructure will be described in detail with reference to FIG. 6 to FIG. 14.

Figure 6:
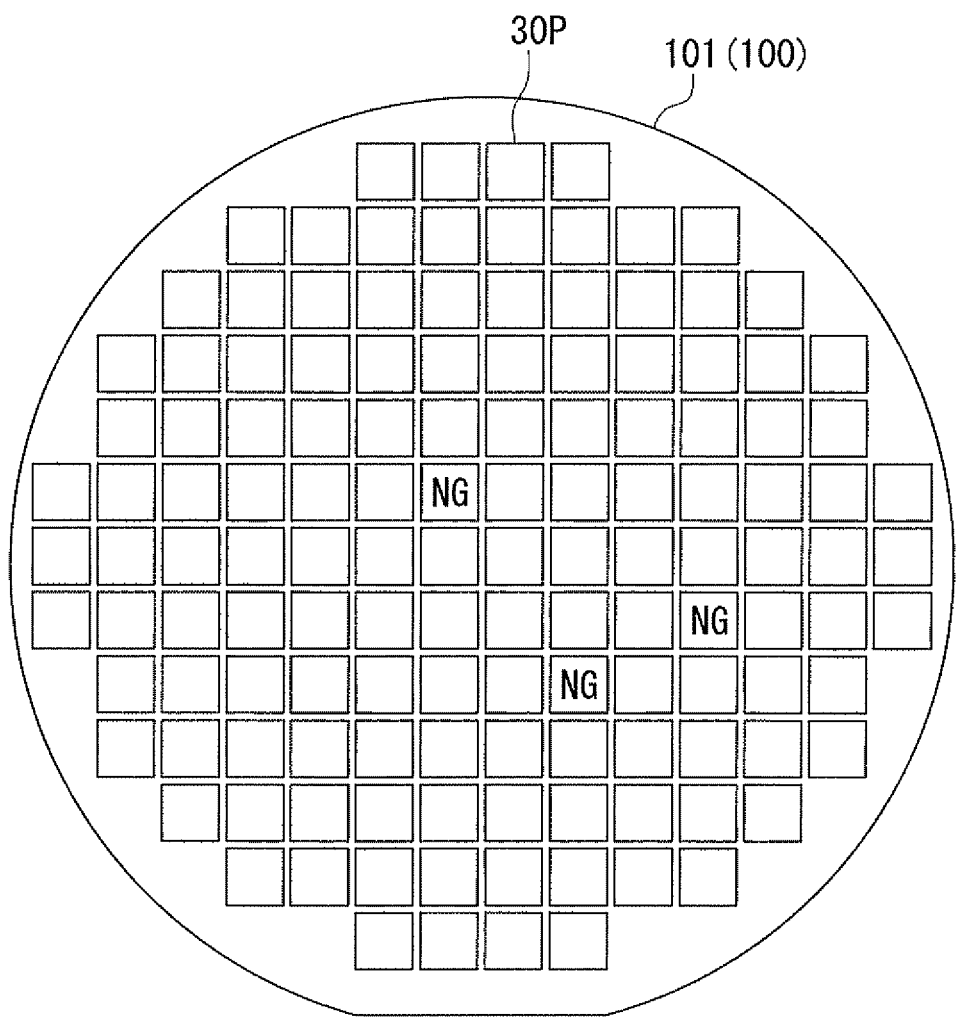
FIG. 6 is a plan view of a pre-array wafer fabricated in a step of a method of manufacturing the layered chip package according to the first embodiment of the invention.
Figure 7:
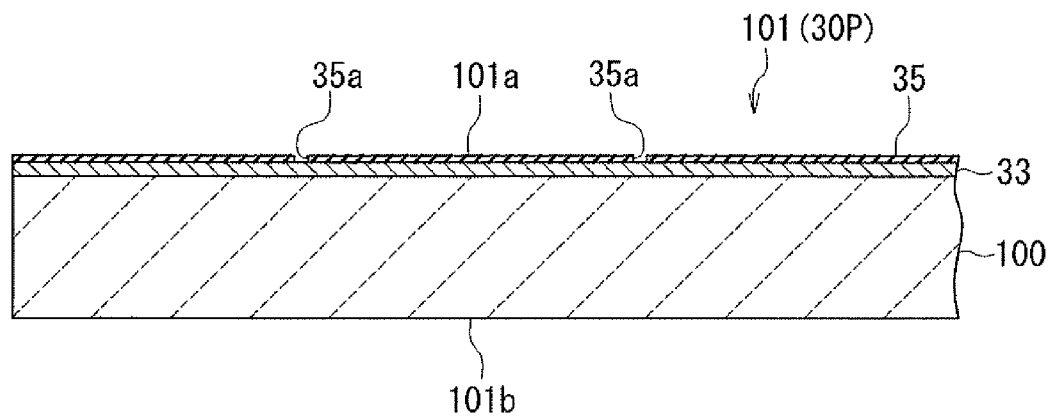
FIG. 7 is a cross-sectional view of a part of the pre-array wafer shown in FIG. 6.

In the step of fabricating the initial substructure, a pre-array wafer 101 is initially fabricated. The pre-array wafer 101 includes an array of a plurality of pre-semiconductor-chip portions 30P that are intended to become individual semiconductor chips 30 to be included in the main body 2. FIG. 6 is a plan view of the pre-array wafer 101. FIG. 7 is a cross-sectional view of a part of the pre-array wafer 101 shown in FIG. 6.

Specifically, in the step of fabricating the pre-array wafer 101, a semiconductor wafer 100 having two surfaces that face toward opposite directions is subjected to processing, such as a wafer process, at one of the two surfaces. The pre-array wafer 101 including an array of a plurality of pre-semiconductor-chip portions 30P each of which includes a device is thereby fabricated. In the pre-array wafer 101, the plurality of pre-semiconductor-chip portions 30P may be in a row, or in a plurality of rows such that a number of pre-semiconductor-chip portions 30P are arranged both in vertical and horizontal directions. In the following description, assume that the plurality of pre-semiconductor-chip portions 30P in the pre-array wafer 101 are in a plurality of rows such that a number of pre-semiconductor-chip portions 30P are arranged both in vertical and horizontal directions. The semiconductor wafer 100 may be a silicon wafer, for example. The wafer process is a process in which a semiconductor wafer is processed into a plurality of devices that are not yet separated into a plurality of chips. For ease of understanding, FIG. 6 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

FIG. 7 shows a part of a pre-semiconductor-chip portion 30P of the pre-array wafer 101. As shown in FIG. 7, the pre-semiconductor-chip portion 30P includes a device-forming region 33 formed near one of the surfaces of the semiconductor wafer 100. The device-forming region 33 is a region where devices are formed by processing the one of the surfaces of the semiconductor wafer 100. Although not shown, the pre-semiconductor-chip portion 30P further includes a plurality of electrode pads arranged on the device-forming region 33. The plurality of electrode pads are electrically connected to the devices formed in the device-forming region 33.

The pre-semiconductor-chip portion 30P further includes a passivation film 35 that is made of an insulating material and covers the device-forming region 33 and the electrode pads. The passivation film 35 has a plurality of openings 35a for exposing the top surfaces of the plurality of electrode pads. Hereinafter, the surface of the pre-array wafer 101 located closer to the passivation film 35 will be referred to as a first surface 101a, and the surface on the opposite side will be referred to as a second surface 101b.

In the step of fabricating the initial substructure, next, a wafer sort test is performed to distinguish the plurality of pre-semiconductor-chip portions 30P included in the pre-array wafer 101 into normally functioning pre-semiconductor-chip portions and malfunctioning pre-semiconductor-chip portions. In this step, a probe of a testing device is brought into contact with the plurality of electrode pads of each pre-semiconductor-chip portion 30P, so that whether the pre-semiconductor-chip portion 30P functions normally or not is tested with the testing device. In FIG. 6, the pre-semiconductor-chip portions 30P marked with "NG" are malfunctioning ones, and the other pre-semiconductor-chip portions 30P are normally functioning ones. This step provides location information on the normally functioning pre-semiconductor-chip portions 30P and the malfunctioning pre-semiconductor-chip portions 30P in each pre-array wafer 101. The location information is used in the step for forming the wiring 31 to be described later.

Figure 8:
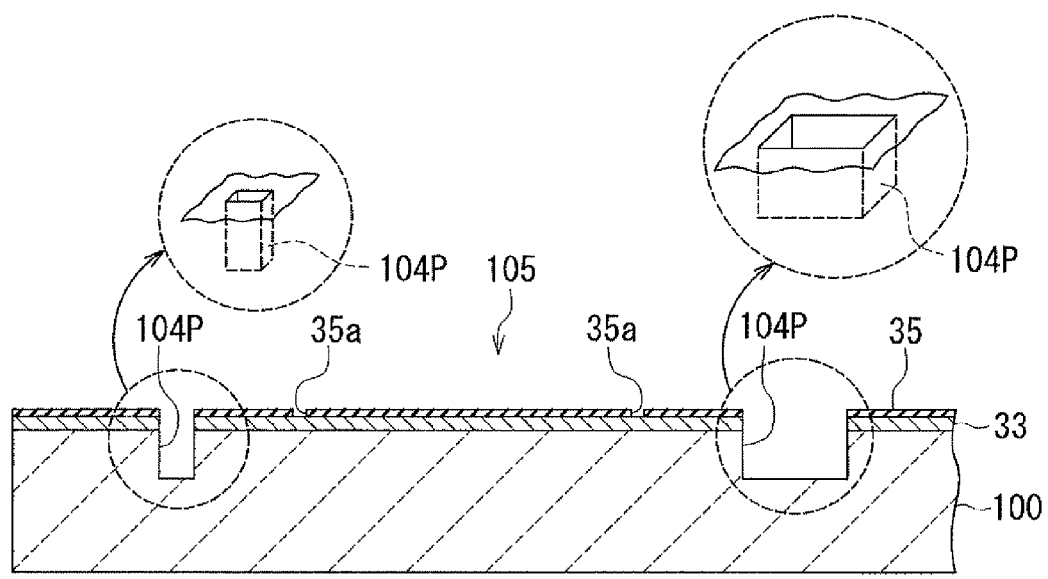
FIG. 8 is a cross-sectional view showing a step that follows the step of FIG. 6.

FIG. 8 is a cross-sectional view showing a step that follows the step of FIG. 6. In this step, a plurality of grooves 104P are formed in the pre-array wafer 101. The plurality of grooves 104P open in the first surface 101a and are to become the plurality of insulator fill holes later. The grooves 104P are formed so that their bottoms do not reach the second surface 101b of the pre-array wafer 101. The grooves 104P have a depth in the range of 50 to 70 µm, for example. The through holes 20 are to be formed later to pass through the inside of the grooves 104P. When viewed in a cross section parallel to the first surface 101a of the pre-array wafer 101, the grooves 104P are therefore larger than the through holes 20. Each groove 104P may let a plurality of through holes 20 through. In FIG. 8, the left groove 104P is for a single through hole 20 to pass through later, while the right groove 104P is for a plurality of through holes 20, such as four, to pass through later. In the foregoing cross section, the grooves 104P are 1.0 to 6.0 µm in diameter, for example. FIG. 8 shows an example where the grooves 104P are rectangular in shape in the foregoing cross section. However, the grooves 104P need not necessarily be rectangular in shape in the foregoing cross section, and may be circular, elliptic, etc. The grooves 104P are formed by, for example, wet etching using KOH as the etching solution or reactive ion etching using a $Cl_2$-based etching gas. Consequently, there is formed a pre-polishing array main body 105 composed of the pre-array wafer 101 having the plurality of grooves 104P.

Figure 9:
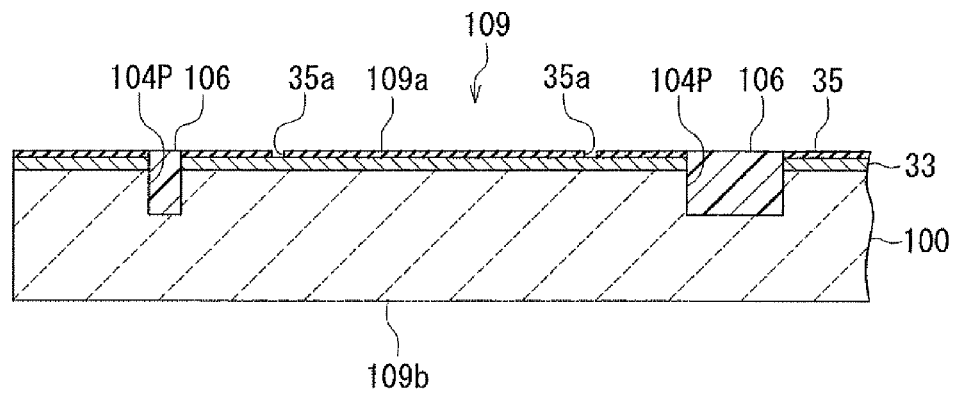
FIG. 9 is a cross-sectional view showing a step that follows the step of FIG. 8.

FIG. 9 shows a step that follows the step of FIG. 8. In this step, the plurality of grooves 104P of the pre-polishing array main body 105 are filled with an insulator so as to form insulating layers 106 made of the insulator. At the same time, the passivation film 35 and the insulating layers 106 are flattened at the top. In this way, there is fabricated a pre-polishing array 109 including the pre-polishing array main body 105 and the insulating layers 106. The pre-polishing array 109 has a first surface 109a corresponding to the first surface 101a of the pre-array wafer 101, and a second surface 109b corresponding to the second surface 101b of the pre-array wafer 101.

The insulator used to form the insulating layers 106 preferably contains resin such as a polyimide resin as its main component. As employed herein, the main component refers to a component that is at or above 50% by weight. Aside from the resin, the insulator may further contain insulating grains mixed with the resin. The insulating grains may be made of $SiO_2$ or $Al_2O_3$, for example. The insulating grains have the function of easing stress that occurs in the insulating layers 106 and increasing the strength of the insulating layers 106.

The insulating layers 106 are formed by the following method, for example. In the method, a fluid insulator containing uncured resin is initially charged into the plurality of grooves 104P. Next, the insulator is heat-treated (cured) at a temperature in the range of, for example, 150° C. to 250° C., whereby the insulator is cured into the insulating layers 106 and the insulating layers 106 are flattened at the top. According to the method, the fluid insulator may contain, aside from the uncured resin, insulating grains mixed with the resin. In such a case, the insulating layers 106 will contain both the cured resin and the insulating grains mixed with the resin.

Instead of the foregoing method, the insulating layers 106 may be formed by the following method, for example. In the method, a fluid insulator that is formed by mixing a raw material solution of a spin-on glass film with uncured resin is applied onto the top surface of the pre-polishing array main body 105 shown in FIG. 8, whereby the plurality of grooves 104P are filled with the insulator and the top surface of the passivation film 35 and the surface of the insulator are flattened. Next, the insulator is cured into the insulating layers 106 by heat treatment. In such a case, the glass component in the raw material solution of the spin-on glass film constitutes the insulating grains that are mixed with the resin in the insulating layers 106.

Figure 10:
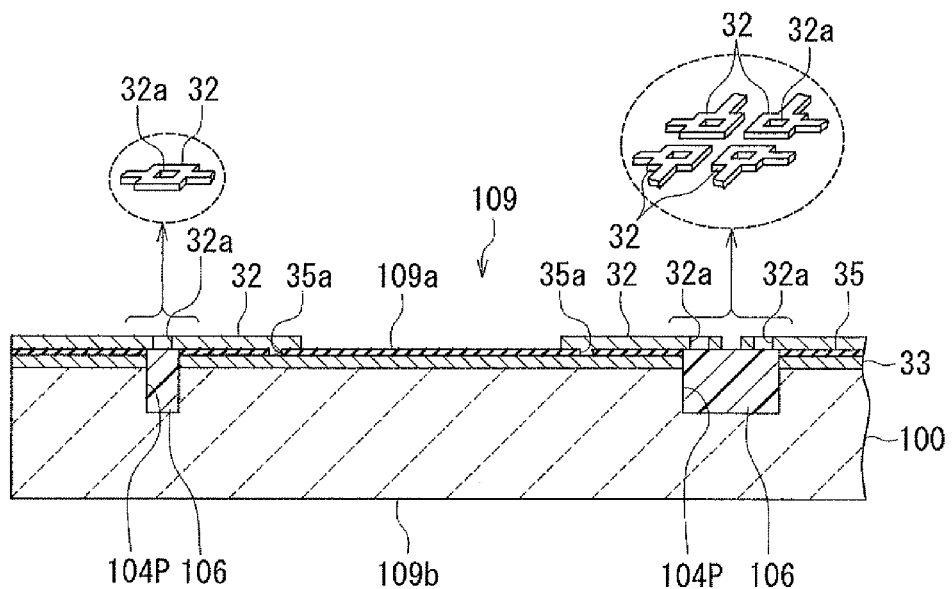
FIG. 10 is a cross-sectional view showing a step that follows the step of FIG. 9.

FIG. 10 shows a step that follows the step of FIG. 9. In this step, the wiring 31 (conductors 32) is formed in the normally functioning pre-semiconductor-chip portions 30P, and not in the malfunctioning pre-semiconductor-chip portions 30P, based on the location information on the normally functioning pre-semiconductor-chip portions 30P and malfunctioning pre-semiconductor-chip portions 30P mentioned previously. This step includes the steps of: patterning a photoresist layer by photolithography to form a frame having a plurality of openings; and forming the plurality of conductors 32 by, for example, plating, so that the conductors 32 are accommodated in the plurality of openings of the frame. The plurality of conductors 32 are electrically connected to the plurality of electrode pads that are arranged on the device-forming region 33, through the plurality of openings 35a of the passivation film 35. If the plurality of openings 35a of the passivation film 35 are also filled with the insulator during the formation of the insulating layers 106, the insulator that fills the openings 35a of the passivation film 35 is removed before the formation of the conductors 32.

The plurality of conductors 32 have their respective electrode pass holes 32a for the plurality of through electrodes 21 to be passed through when the plurality of through electrodes 21 are formed later. The wall faces of the electrode pass holes 32a appear in the wall faces of the through holes 20, and will make contact with the outer surfaces of the through electrodes 21 later. Consequently, the wall faces of the electrode pass holes 32a constitute the end faces of the conductors 32 which make contact with the outer surfaces of the through electrodes 21.

The electrode pass holes 32a are located on the top surfaces of the insulating layers 106. The electrode pass holes 32a are smaller in diameter than the grooves 104P. When the plurality of through electrodes 21 are formed, the wall faces of the electrode pass holes 32a make contact with the outer surfaces of the through electrodes 21 that pass through the respective electrode pass holes 32a. Only a single electrode pass hole 32a of a single conductor 32 lies on the top surface of the left insulating layer 106 in FIG. 10. Four electrode pass holes 32a of four conductors 32 lie on the top surface of the right insulating layer 106 in FIG. 10.

Figure 11:
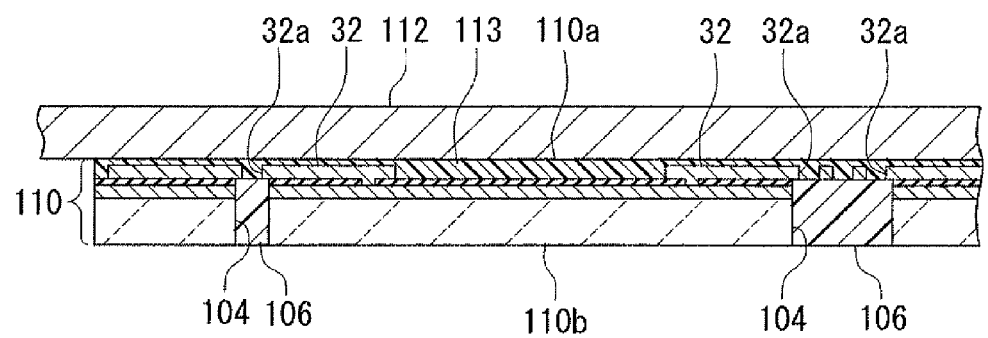
FIG. 11 is a cross-sectional view showing a step that follows the step of FIG. 10.

FIG. 11 shows a step that follows the step of FIG. 10. In this step, using an adhesive made of an insulating resin, the pre-polishing array 109 is initially bonded to a plate-shaped jig 112 shown in FIG. 11, with the first surface 109a of the pre-polishing array 109 arranged to face one of the surfaces of the jig 112. Hereinafter, the pre-polishing array 109 bonded to the jig 112 will be referred to as a first pre-polishing array 109. The reference numeral 113 in FIG. 11 indicates an insulating layer formed by the adhesive.

Next, the second surface 109b of the first pre-polishing array 109 is polished. This polishing is performed until the plurality of grooves 104P are exposed. This polishing makes the plurality of grooves 104P into the plurality of insulator fill holes 104. By polishing the second surface 109b of the first pre-polishing array 109, the first pre-polishing array 109 is thinned. This forms a chip array 110 in the state of being bonded to the jig 112. The chip array 110 has a thickness of 20 to 60 μm, for example. The chip array 110 includes an array of a plurality of pre-semiconductor-chip portions 30P. Hereinafter, the chip array 110 bonded to the jig 112 will be referred to as a first chip array 110. The first chip array 110 has a first surface 110a corresponding to the first surface 109a of the first pre-polishing array 109, and a second surface 110b opposite to the first surface 110a. The second surface 110b is the polished surface.

Figure 12:
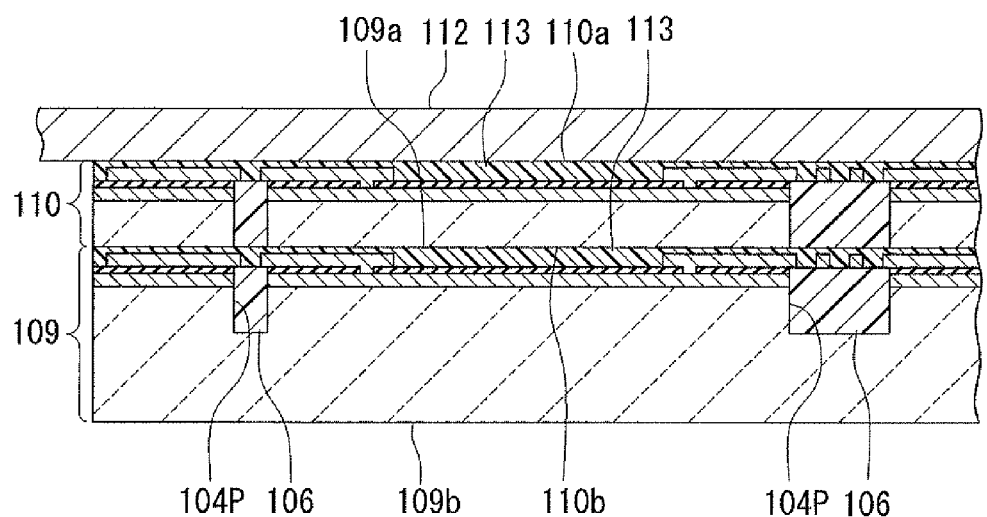
FIG. 12 is a cross-sectional view showing a step that follows the step of FIG. 11.

FIG. 12 shows a step that follows the step of FIG. 11. In this step, using an adhesive made of an insulating resin, a pre-polishing array 109 is initially bonded to the first chip array 110 bonded to the jig 112. The pre-polishing array 109 is bonded to the first chip array 110 with the first surface 109a arranged to face the polished surface, i.e., the second surface 110b, of the first chip array 110. Hereinafter, the pre-polishing array 109 bonded to the first chip array 110 will be referred to as a second pre-polishing array 109. The adhesive that bonds the first chip array 110 and the second pre-polishing array 109 to each other forms the insulating layer 113.

Next, although not shown, the second surface 109b of the second pre-polishing array 109 is polished. This polishing is performed until the plurality of grooves 104P are exposed. This polishing makes the plurality of grooves 104P into the plurality of insulator fill holes 104. By polishing the second surface 109b of the second pre-polishing array 109, the second pre-polishing array 109 is thinned. This forms a second chip array 110 in the state of being bonded to the first chip array 110. The second chip array 110 has a thickness of, for example, 20 to 60 µm, as does the first chip array 110.

Figure 13:
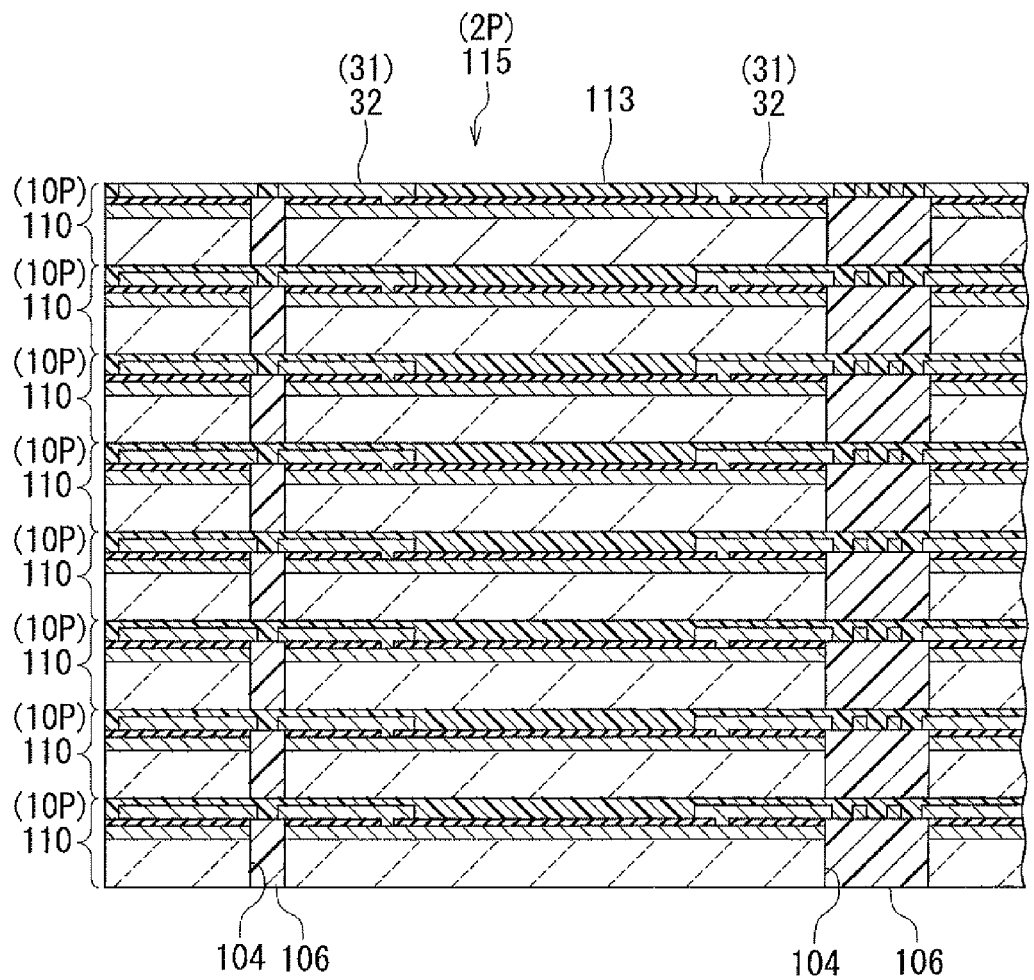
FIG. 13 is a cross-sectional view showing a step that follows the step of FIG. 12.
Figure 14:
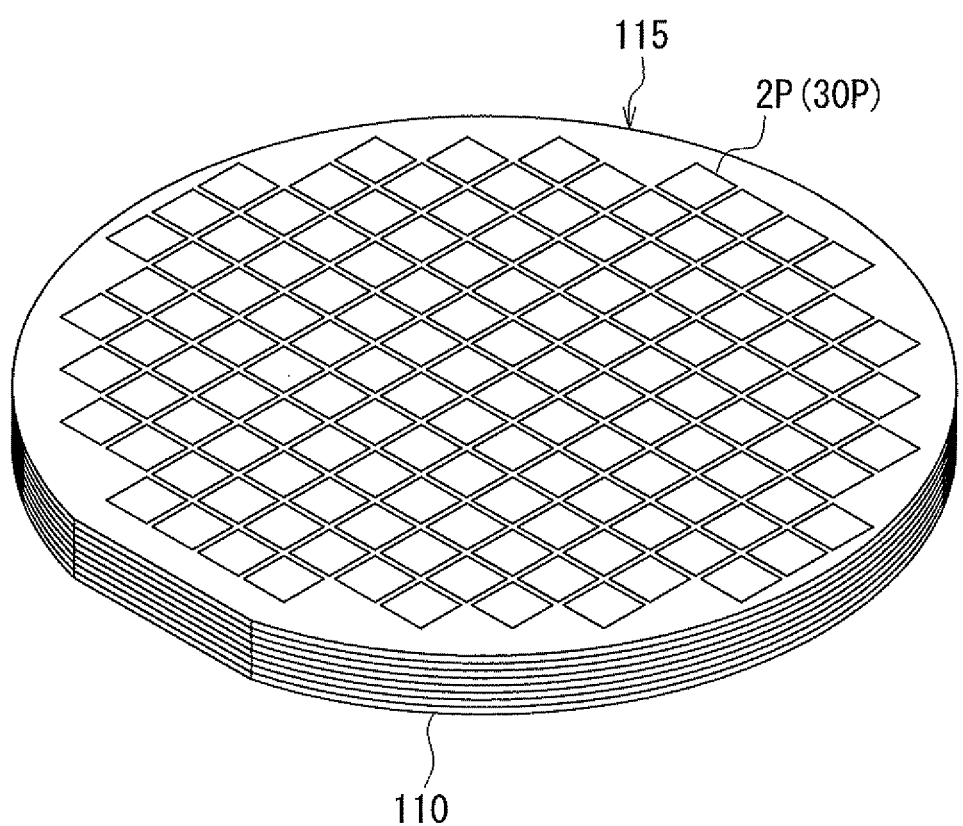
FIG. 14 is a perspective view of an initial substructure fabricated in the step of FIG. 13.

FIG. 13 shows a step that follows the step of FIG. 12. In this step, the same step as shown in FIG. 12 is repeated to form a stack of a predetermined number of chip arrays 110. FIG. 13 shows the case where a stack of eight chip arrays 110 is formed. Next, the stack of chip arrays 110 is released from the jig 112. Next, the uppermost chip array 110 in the stack of chip arrays 110 is subjected to etching or polishing so that the insulating layer 113 is removed in part to expose the plurality of conductors 32. Respective portions of the plurality of conductors 32 thus exposed constitute the plurality of terminals 4. Consequently, there is formed an initial substructure 115 including the plurality of stacked chip arrays 110. FIG. 14 is a perspective view of the initial substructure 115.

Each chip array 110 includes an array of a plurality of pre-semiconductor-chip portions 30P. The initial substructure 115 includes a plurality of initial main body portions 2P that are arranged in the directions orthogonal to the stacking direction of the plurality of layer portions 10. Each initial main body portion 2P is to undergo the formation of a plurality of through holes 20 therein later to thereby become a main-body-forming portion.

FIG. 13 shows a part of one of the plurality of initial main body portions 2P included in the initial substructure 115. As shown in FIG. 13, the initial main body portion 2P includes a plurality of stacked initial layer portions 10P which are the plurality of stacked layer portions 10 before the formation of the plurality of through holes 20. Each of the plurality of initial layer portions 10P includes a pre-semiconductor-chip portion 30P. In the following description, the pre-semiconductor-chip portion 30P after the formation of the initial substructure 115 will be referred to as a semiconductor chip 30. Each of the plurality of initial layer portions 10P includes a plurality of insulator fill holes 104 that are formed to penetrate the semiconductor chip 30, and insulating layers 106 that are made of the insulator and fill the respective insulator fill holes 104. Note that the insulating layer 113 is a component of the initial layer portion 10P that is located directly below.

All the plurality of initial main body portions 2P included in the initial substructure 115 may include no malfunctioning semiconductor chip 30. Alternatively, at least one of the plurality of initial main body portions 2P may include one or more normally functioning semiconductor chips 30 and one or more malfunctioning semiconductor chips 30.

Figure 15:
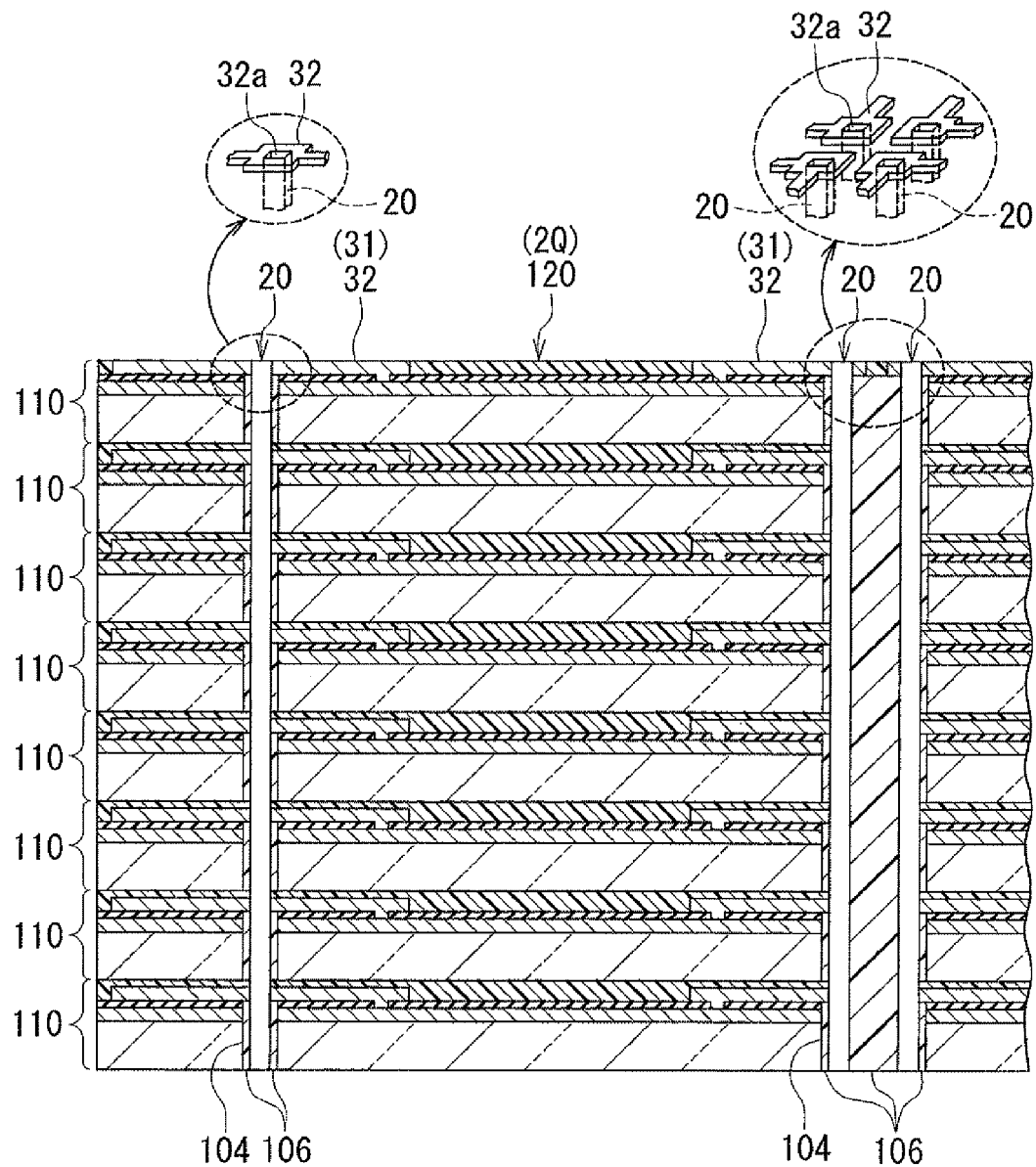
FIG. 15 is a cross-sectional view of a part of a substructure fabricated in a step that follows the step of FIG. 13.
Figure 16:
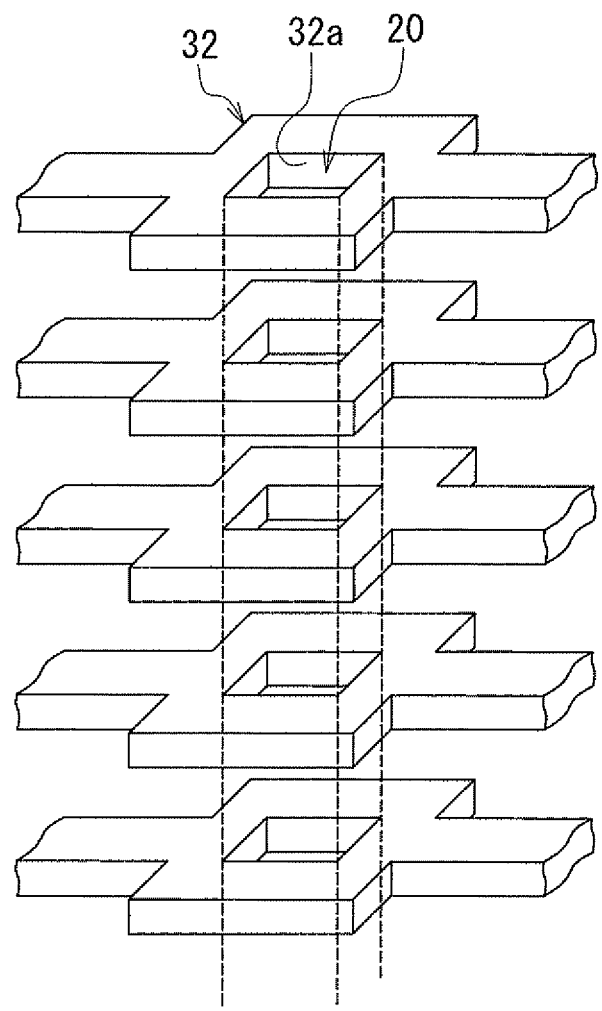
FIG. 16 is a perspective view of a part of wiring of the substructure shown in FIG. 15.

Next, the step of forming a substructure from the initial substructure 115 will be described with reference to FIG. 15 and FIG. 16. FIG. 15 is a cross-sectional view of a part of the substructure fabricated in a step that follows the step of FIG. 13. FIG. 16 is a perspective view of a part of the wiring of the substructure shown in FIG. 15. In this step, a plurality of through holes 20 are formed in each of the plurality of initial main body portions 2P of the initial substructure 115. The initial main body portions 2P are thereby made into main-body-forming portions 2Q, and the initial substructure 115 is made into a substructure 120. The substructure 120 includes a plurality of main-body-forming portions 2Q that are arranged in the directions orthogonal to the stacking direction of the plurality of layer portions 10. FIG. 15 shows a part of one of the plurality of main-body-forming portions 2Q included in the substructure 120.

All the plurality of main-body-forming portions 2Q included in the substructure 120 may include no malfunctioning semiconductor chip 30. Alternatively, at least one of the plurality of main-body-forming portions 2Q may include one or more normally functioning semiconductor chips 30 and one or more malfunctioning semiconductor chips 30.

As shown in FIG. 15, the plurality of through holes 20 are formed to penetrate the plurality of insulating layers 106 that align in the stacking direction of the plurality of chip arrays 110 (initial layer portions 10P). One through hole 20 runs through the left insulating layers 106 in FIG. 15. Four through holes 20 run through the right insulating layers 106 in FIG. 15. As mentioned previously, each of the plurality of conductors 32 has an electrode pass hole 32a for any one of the plurality of through electrodes 21 to be passed through when the plurality of through electrodes 21 are formed later. As shown in FIG. 15 and FIG. 16, each single through hole 20 is formed to pass through the electrode pass holes 32a of the plurality of conductors 32 that align in the stacking direction of the plurality of chip arrays 110 (initial layer portions 10P), and to penetrate the substructure 120 (main-body-forming portion 2Q). The through holes 20 have a diameter equal to that of the electrode pass holes 32a and smaller than that of the insulator fill holes 104. After the formation of the through holes 20, as shown in FIG. 15, the original insulting layers 106 are therefore left in part around the through holes 20 inside the insulator fill holes 104.

The plurality of through holes 20 can be formed by laser processing, for example. If the insulating layers 106 are made of an insulator that contains resin as its main component, the laser processing can be used to form the plurality of through holes 20 easily in a short time.

Figure 17:
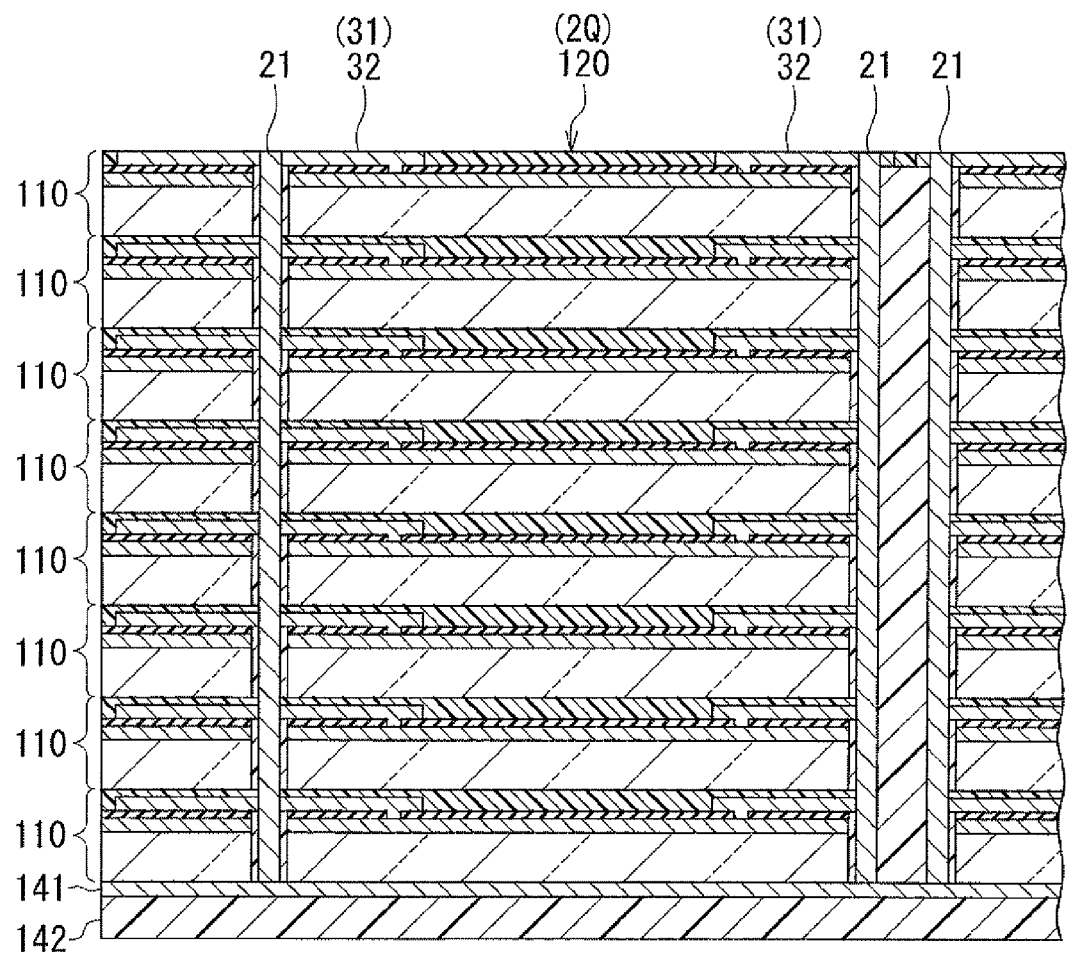
FIG. 17 is a cross-sectional view showing a step that follows the step of FIG. 15.
Figure 18:
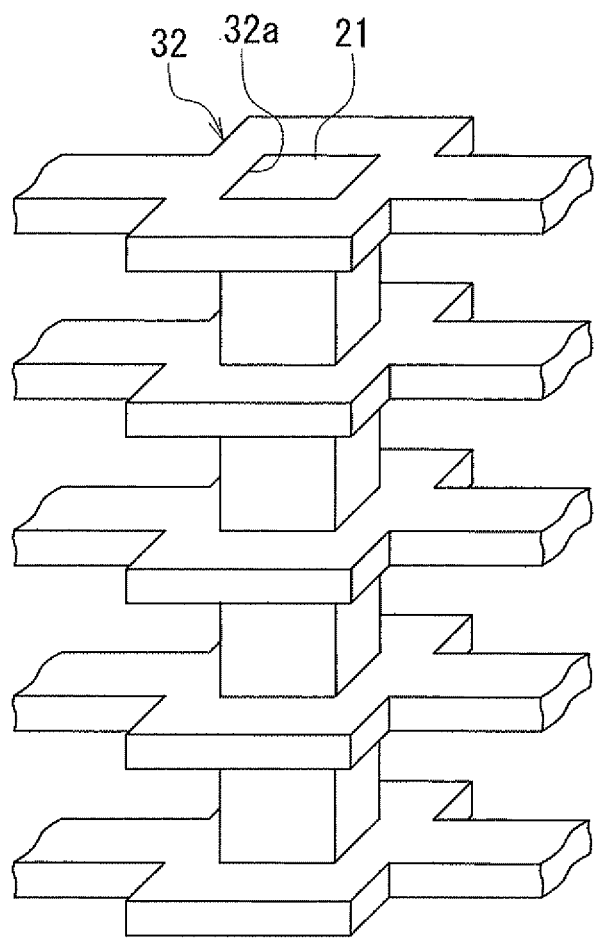
FIG. 18 is a perspective view showing a through electrode formed in the step of FIG. 17.
Figure 19:
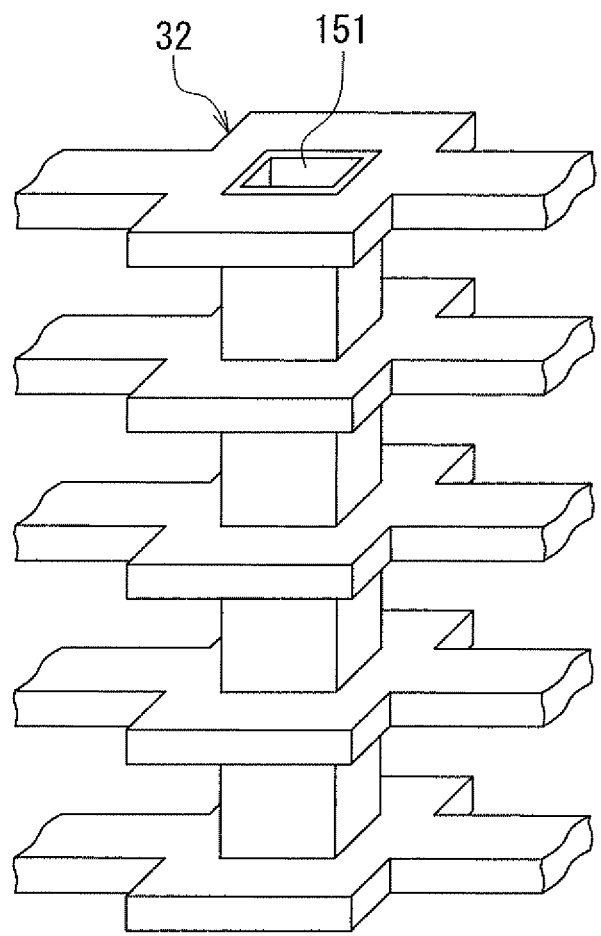
FIG. 19 is a perspective view showing a modification example of the step of FIG. 17.

Reference is now made to FIG. 17 to FIG. 19 to describe the step of forming the plurality of through electrodes 21 in the plurality of through holes 20 in the main-body-forming portion 2Q of the substructure 120. FIG. 17 is a cross-sectional view showing a step that follows the step of FIG. 15. FIG. 18 is a perspective view showing the through electrode 21 formed in the step of FIG. 17. FIG. 19 is a perspective view showing a modification example of the step of FIG. 17.

In this step, the plurality of through electrodes 21 are formed in the plurality of through holes 20 by plating, for example. In this step, as shown in FIG. 17, a seed layer 141 for plating is initially bonded to the bottom surface of the lowermost chip array 110 of the substructure 120. The seed layer 141 is formed of a metal such as Cu. The seed layer 141 may be a metal film supported by a plate 142 of resin or the like. Alternatively, the seed layer 141 may be a metal plate. In such a case, the plate 142 for supporting the seed layer 141 is unnecessary.

Next, the through electrodes 21 each made of a plating film are formed in the respective plurality of through holes 20 of the substructure 120 by electroplating. Here, the seed layer 141 is energized, so that the plating films grow from the surface of the seed layer 141 to fill the through holes 20.

FIG. 18 shows a plurality of conductors 32 that align in the stacking direction of the plurality of chip arrays 110, and one through electrode 21. As mentioned previously, each of the plurality of conductors 32 has an electrode pass hole 32a for any one of the plurality of through electrodes 21 to be passed through. When the plurality of through electrodes 21 are formed, the wall faces of the electrode pass holes 32a make contact with the outer surfaces of the through electrodes 21 that pass through the respective electrode pass holes 32a. Consequently, the conductors 32 are electrically connected to the through electrodes 21, and the semiconductor chips 30 and the through electrodes 21 are electrically connected by the wiring 31 including the plurality of conductors 32.

Referring to FIG. 19, a description will now be given of a modification example of the step shown in FIG. 17. In the modification example, the formation of the plurality of through electrodes 21 by electroplating is preceded by the formation of seed layers 151 each made of a metal film. The seed layers 151 are formed on the respective wall faces of the plurality of through holes 20 in the substructure 120 by electroless plating. Subsequently, plating films are respectively formed in the plurality of through holes 20 in the substructure 120 by electroplating. Here, the seed layers 151 are energized, so that the plating films grow from the surfaces of the seed layers 151 to fill the through holes 20. In this modification example, the seed layers 151 and the plating films constitute the through electrodes 21. Instead of such a modification example, the plurality of through electrodes 21 may be formed by using electroless plating alone.

When manufacturing a layered chip package 1 that has a plurality of terminals 5 disposed on the bottom surface 2b of the main body 2, the formation of the plurality of through electrodes 21 is followed by the formation of the plurality of terminals 5. Here, the terminals 5 are formed on the bottom surfaces of the plurality of main-body-forming portions 2Q of the substructure 120 by plating, for example.

Figure 20:
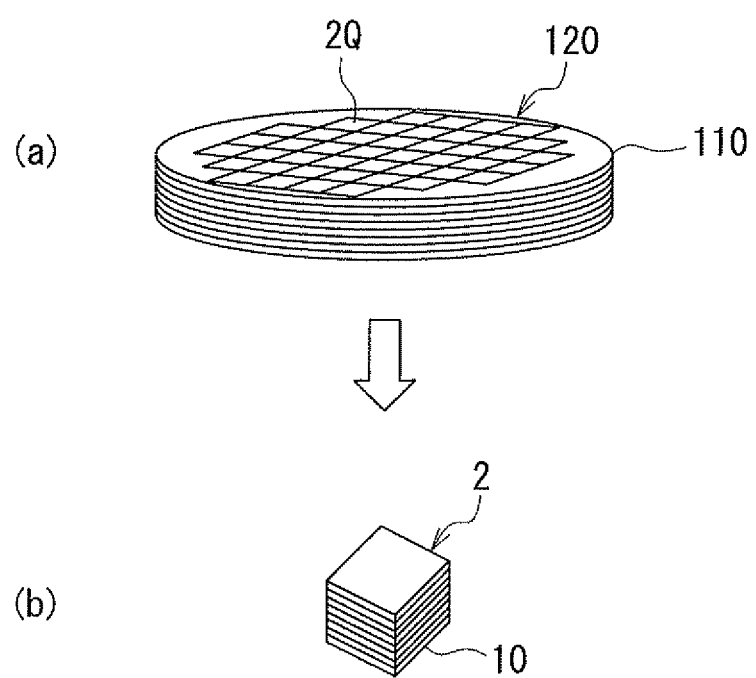
FIG. 20 is an explanatory diagram showing the step of separating a plurality of main-body-forming portions from each other into a plurality of main bodies in the first embodiment of the invention.

Next, referring to FIG. 20, a description will be given of the step of separating the plurality of main-body-forming portions 2Q of the substructure 120 from each other into a plurality of main bodies 2 after the step of forming the plurality of through electrodes 21. Portion (a) of FIG. 20 shows a substructure 120. The substructure 120 includes a plurality of main-body-forming portions 2Q that are arranged in the directions orthogonal to the stacking direction of the plurality of layer portions 10. In this step, the substructure 120 is cut so that the plurality of main-body-forming portions 2Q in the substructure 120 are separated from each other into a plurality of main bodies 2. Portion (b) of FIG. 20 shows one of the plurality of main bodies 2 formed thus. Such cutting of the substructure 120 makes the initial layer portions 10P having the through holes 20 and through electrodes 21 into the layer portions 10. The main body 2 includes a plurality of layer portions 10 stacked. Each of the plurality of layer portions 10 includes a semiconductor chip 30.

A plurality of layered chip packages 1 are thus fabricated through the series of steps that have been described with reference to FIG. 6 to FIG. 20. So far the description has dealt with the case where a plurality of layered chip packages 1 each including eight layer portions 10 are fabricated from the initial substructure 115 that includes eight chip arrays 110 as shown in FIG. 13. In the present embodiment, however, the number of the chip arrays 110 to be included in the initial substructure 115 can be changed to fabricate a plurality of types of layered chip packages 1 with different numbers of layer portions 10.

As has been described above, according to the layered chip package 1, the method of manufacturing the same, and the substructure 120 of the present embodiment, a plurality of through electrodes 21 that penetrate all the plurality of layer portions 10 stacked are formed in the plurality of through holes 20 that penetrate all the plurality of layer portions 10. This makes it possible to manufacture a layered chip package having a plurality of through electrodes in a small number of steps. Consequently, according to the present embodiment, it is possible to mass-produce the layered chip package 1 at low cost in a short time.

In a layered chip package of conventional through electrode method, a plurality of through electrodes are formed in each of a plurality of layer portions stacked. The through electrodes of the lower one of two layer portions and those of the upper one are electrically connected to each other. In such a case, the electrical connection between a plurality of semiconductor chips can deteriorate in reliability due to a deviation in position or an increase in resistance between the through electrodes of the lower layer portion and those of the upper layer portion.

In contrast, according to the present embodiment, the layered chip package 1 has the plurality of through electrodes 21 that penetrate all the plurality of layer portions 10. Such a configuration avoids the foregoing problem. According to the present embodiment, it is therefore possible to improve the reliability of the electrical connection between the plurality of semiconductor chips 30.

In the present embodiment, as shown in FIG. 18, the plurality of conductors 32 of the wiring 31 have their respective electrode pass holes 32a. The wall faces of the electrode pass holes 32a are in contact with the outer surfaces of the through electrodes 21 that pass through the respective electrode pass holes 32a. This provides increased contact areas between the conductors 32 and the through electrodes 21. It is therefore possible to improve the reliability of the electrical connection between the conductors 32 and the through electrodes 21.

Now, suppose that the semiconductor chips 30 and the plurality of through electrodes 21 are electrically connected by the wiring 31 even in the second-type layer portions 10B which include defective semiconductor chips 30. In such a case, the wiring 31 in the layer portions 10B can cause unwanted capacitances and unwanted inductances to the device that is implemented by the layered chip package 1, such as a memory device, and can also cause stray capacitances with the wiring 31 that is connected to conforming semiconductor chips 30. Such problems hamper quick device operation of the memory device or the like.

In contrast, according to the present embodiment, the second-type layer portions 10B which include defective semiconductor chips 30 are not provided with the wiring 31 that electrically connects the semiconductor chips 30 to the through electrodes 21. Therefore, in the layered chip package 1, the second-type layer portions 10 which include defective semiconductor chips 30 can be regarded as merely insulating layers. The present embodiment thus makes it possible to disable the use of defective semiconductor chips 30 and suppress the problems that would result from any wiring connected to defective semiconductor chips 30.

Second Embodiment

Figure 21:
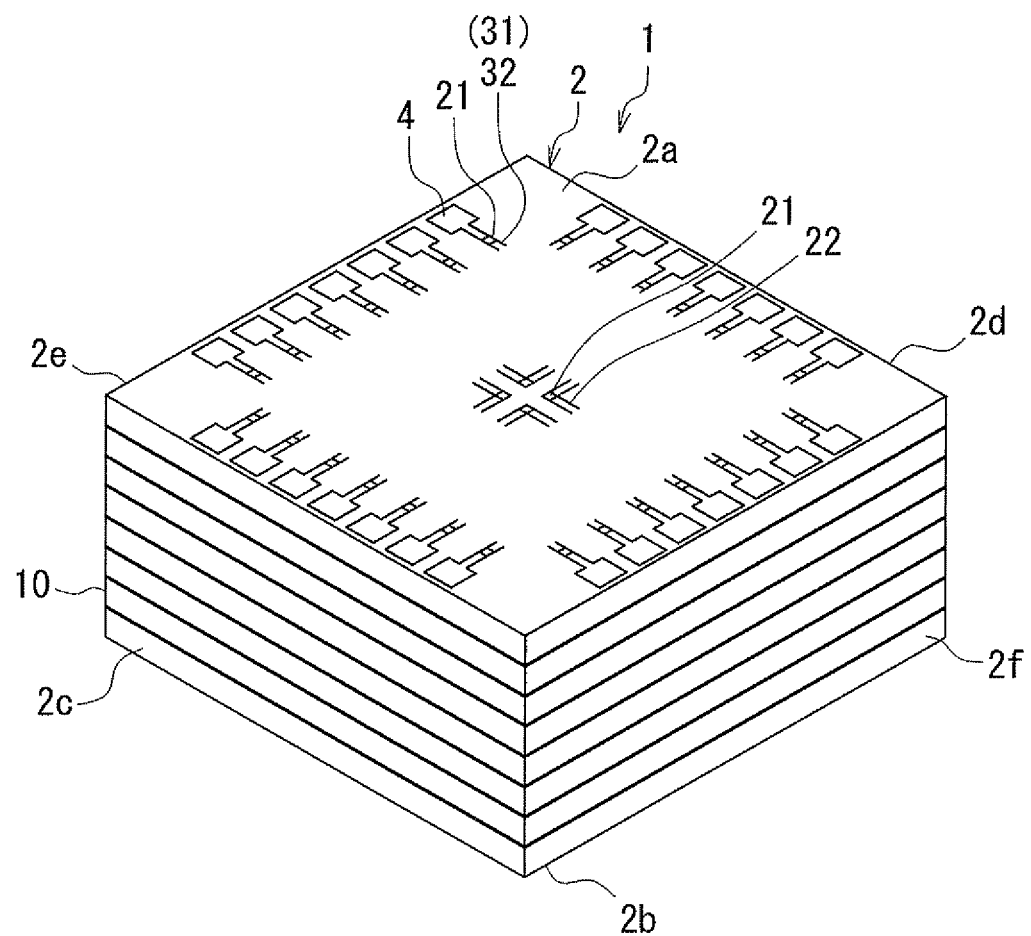
FIG. 21 is a perspective view of a layered chip package according to a second embodiment of the invention.
Figure 22:
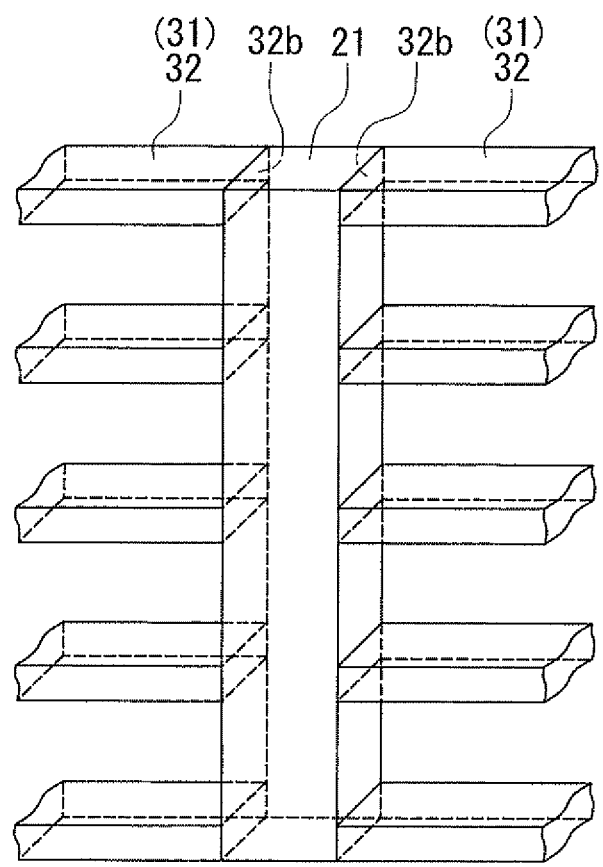
FIG. 22 is a perspective view showing part of the wiring and through electrode of the second embodiment of the invention.

A second embodiment of the present invention will now be described with reference to FIG. 21 and FIG. 22. FIG. 21 is a perspective view of the layered chip package according to the present embodiment. FIG. 22 is a perspective view showing part of the wiring and through electrode of the present embodiment.

In the present embodiment, as shown in FIG. 21 and FIG. 22, each of the plurality of conductors 32 of the wiring 31 does not have the electrode pass hole 32a of the first embodiment, but instead has an end face 32b that makes contact with the outer surface of a through electrode 21. In the present embodiment, the end faces 32b of the conductors 32 are exposed in the wall faces of the through holes 20 in the substructure 120 before the formation of the plurality of through electrodes 21. When the plurality of through electrodes 21 are formed, the end faces 32b of the conductors 32 make contact with the outer surfaces of a through electrode 21. The conductors 32 are thereby electrically connected to the through electrodes 21.

In other respects, the configuration of the present embodiment is the same as that of the first embodiment. The operation and effects of the present embodiment are the same as those of the first embodiment except where the electrode pass holes 32a are concerned.

Third Embodiment

Figure 23:
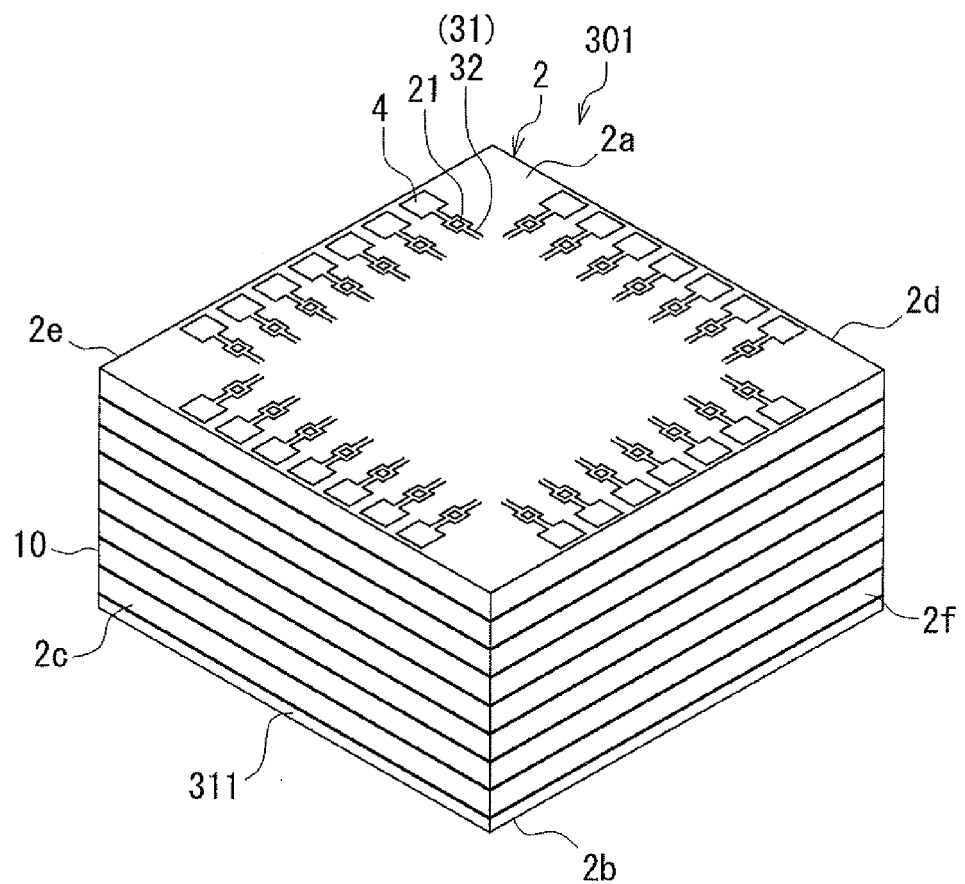
FIG. 23 is a perspective view of a layered chip package according to a third embodiment of the invention.
Figure 24:
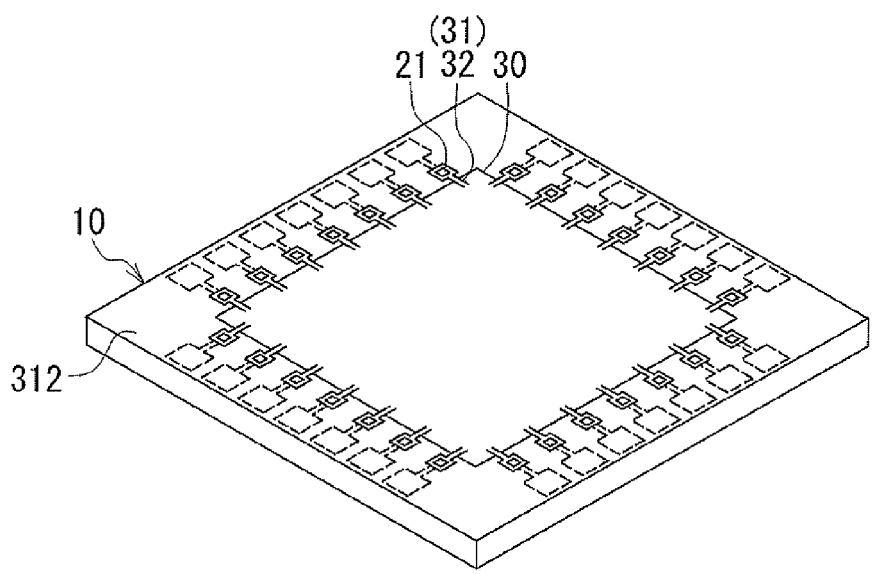
FIG. 24 is a perspective view of one of the layer portions shown in FIG. 23.
Figure 25:
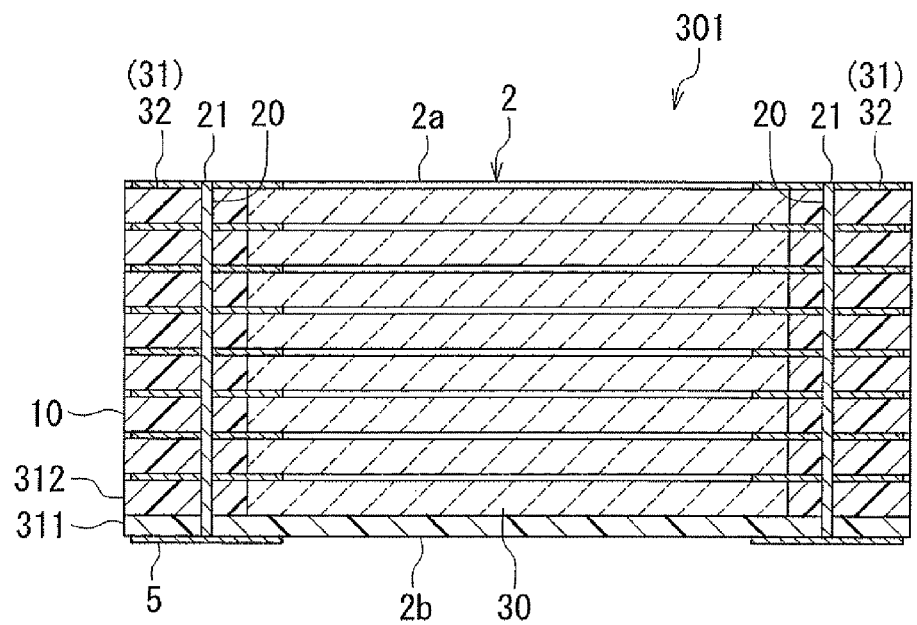
FIG. 25 is a cross-sectional view of the layered chip package shown in FIG. 23.

A third embodiment of the present invention will now be described. First, the configuration of the layered chip package according to the present embodiment will be described with reference to FIG. 23 to FIG. 25. FIG. 23 is a perspective view of the layered chip package according to the present embodiment. FIG. 24 is a perspective view of one of the layer portions shown in FIG. 23. FIG. 25 is a cross-sectional view of the layered chip package shown in FIG. 23.

The layered chip package 301 according to the present embodiment includes a main body 2 which is generally rectangular-solid-shaped, as in the first embodiment. The main body 2 has a top surface 2a, a bottom surface 2b, and four side surfaces 2c, 2d, 2e, and 2f. The main body 2 of the present embodiment includes an insulating base 311 and a plurality of layer portions 10 stacked on the base 311. The base 311 is made of resin, for example. By way of example, FIG. 23 and FIG. 25 show the case where the main body 2 includes eight layer portions 10. The number of the layer portions 10 to be included in the main body 2 is not limited to eight, and may be any plural number. Every two vertically adjacent layer portions 10 are bonded to each other with an adhesive made of an insulating resin.

The layered chip package 301 further includes a plurality of terminals 4 disposed on the top surface 2a of the main body 2, and a plurality of terminals 5 disposed on the bottom surface 2b of the main body 2. Note that the layered chip package 301 may include either one and not both of the terminals 4 and the terminals 5.

As shown in FIG. 24 and FIG. 25, each layer portion 10 of the present embodiment includes a semiconductor chip 30 and an insulating layer 312 disposed around the semiconductor chip 30. The insulating layer 312 is made of resin, for example.

As shown in FIG. 25, the main body 2 further includes a plurality of through holes 20 that penetrate the base 311 and all the plurality of layer portions 10 included in the main body 2. In the present embodiment, the plurality of through holes 20 penetrate the insulating layers 312 of the plurality of layer portions 10. The layered chip package 301 further includes a plurality of through electrodes 21 that are provided in the plurality of through holes 20 of the main body 2 and penetrate the base 311 and all the plurality of layer portions 10. The through electrodes 21 are made of Cu, Au, Ni, Cr, or Zn, for example.

At least one of the plurality of layer portions 10 included in the main body 2 includes wiring 31 that electrically connects the semiconductor chip 30 to the plurality of through electrodes 21. The wiring 31 includes a plurality of conductors 32 that are electrically connected to the plurality of through electrodes 21. The plurality of conductors 32 have their respective end faces that appear in the wall faces of the plurality of through holes 20 and make come with the outer surfaces of the through electrodes 21. The conductors 21 may be made of Cu, for example. At least another one of the plurality of layer portions 10 included in the main body 2 may be without the wiring 31.

In the example shown in FIG. 23, the plurality of terminals 4 are formed of respective portions of the conductors 32 of the uppermost layer portion 10. The plurality of terminals 4 may be formed of other plurality of conductors that are electrically connected to the conductors 32. The plurality of terminals 5 are electrically connected to the bottom ends of the through electrodes 21 that are located in the bottom surface 2b of the main body 2.

In FIG. 24, the portions of the plurality of conductors 32 to form the plurality of terminals 4 are shown by the broken lines. If the plurality of terminals 4 are formed of respective portions of the conductors 32 of the uppermost layer portion 10, the conductors 32 of the other layer portions 10 may or may not include the portions that are shown by the broken lines in FIG. 24.

Reference is now made to FIG. 26 to FIG. 32 to describe a method of manufacturing the layered chip package 301 according to the present embodiment. Like the first embodiment, the method of manufacturing the layered chip package 301 includes the step of fabricating a substructure. The substructure includes at least one main-body-forming portion which is a portion to be the main body 2. The main-body-forming portion includes the base 311, the plurality of layer portions 10, and the plurality of through holes 20 without the through electrodes 21. The method of manufacturing the layered chip package 301 further includes the step of forming the plurality of through electrodes 21 in the plurality of through holes 20 in the main-body-forming portion of the substructure.

The step of fabricating the substructure includes the steps of: fabricating an initial substructure that is intended to undergo the formation of the plurality of through holes 20 therein later to thereby become the substructure; and forming the substructure by forming the plurality of through holes 20 in the initial substructure.

Hereinafter, the method of manufacturing the layered chip package 301 will be described in detail in conjunction with an example where the substructure includes a plurality of main-body-forming portions that are arranged in the directions orthogonal to the stacking direction of the plurality of layer portions 10.

Figure 26:
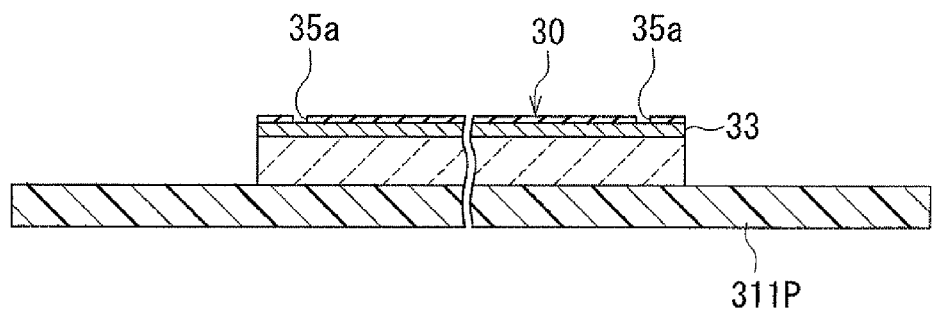
FIG. 26 is a cross-sectional view showing a step of a method of manufacturing the layered chip package according to the third embodiment of the invention.

FIG. 26 is a cross-sectional view showing a step of the method of manufacturing the layered chip package 301. In the method of manufacturing the layered chip package 301, a substrate is initially prepared that includes a plurality of pre-base portions to be bases 311. Semiconductor chips 30 are mounted on the respective plurality of pre-base portions of the substrate. FIG. 26 shows one of the pre-base portions 311P of the substrate, and the semiconductor chip 30 mounted thereon. Hereinafter, the method of manufacturing the layered chip package 301 will be described, focusing on a single pre-base portion 311P. When mounting the semiconductor chip 30 on the pre-base portion 311P, a metal layer may be formed on the pre-base portion 311P so that the semiconductor chip 30 is bonded onto the metal layer. The semiconductor chip 30 mounted on the pre-base portion 311P is to be the semiconductor chip 30 of the lowermost layer portion 10 of the main body 2.

The semiconductor chip 30 includes a device-forming region 33, a plurality of electrode pads (not shown) arranged on the device-forming region 33, and a passivation film 35 that is made of an insulating material and covers the device-forming region 33 and the electrode pads. The passivation film 35 has a plurality of openings 35a for exposing the top surfaces of the electrode pads.

Figure 27:
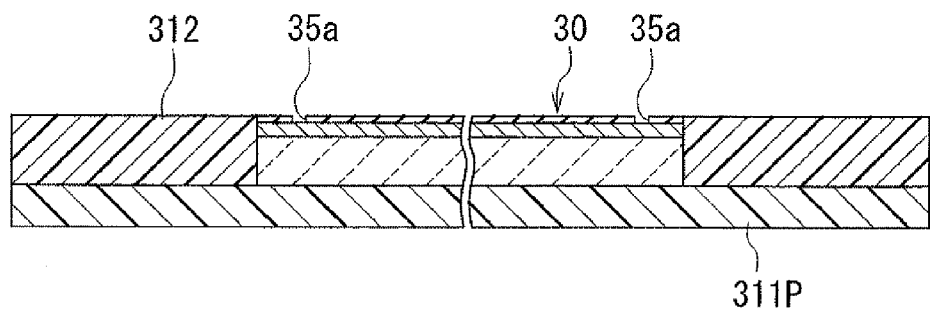
FIG. 27 is a cross-sectional view showing a step that follows the step of FIG. 26.

FIG. 27 is a cross-sectional view showing a step that follows the step of FIG. 26. In this step, an insulating layer 312 is formed on the pre-base portion 311P to surround the semiconductor chip 30. The passivation film 35 and the insulating layer 312 are then flattened at the top.

Figure 28:
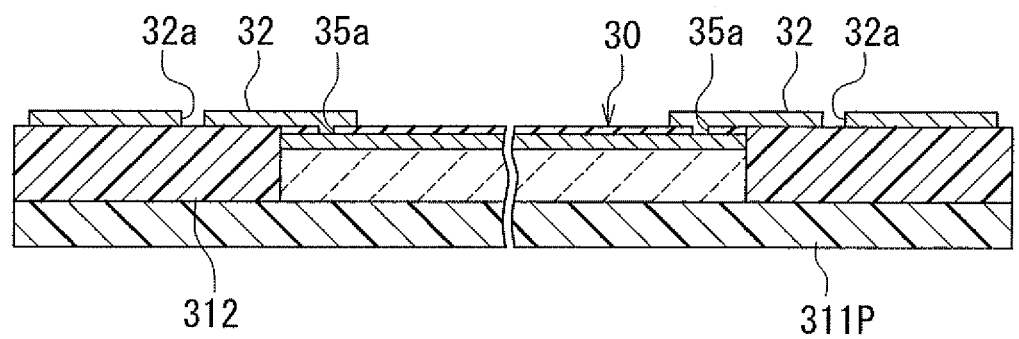
FIG. 28 is a cross-sectional view showing a step that follows the step of FIG. 27.

FIG. 28 is a cross-sectional view showing a step that follows the step of FIG. 27. In this step, a plurality of conductors 32 to constitute the wiring 31 are formed on the passivation film 35 and the insulating layer 312. The plurality of conductors 32 are electrically connected to the plurality of electrode pads that are arranged on the device-forming region 33, through the plurality of openings 35a of the passivation film 35. As in the first embodiment, the following description will deal with an example where each of the plurality of conductors 32 has an electrode pass hole 32a for any one of the plurality of through electrodes 21 to be passed through when the plurality of through electrodes 21 are formed later. Nevertheless, as in the second embodiment, each of the plurality of conductors 32 may have no electrode pass hole 32a but an end face 32b instead.

Figure 29:
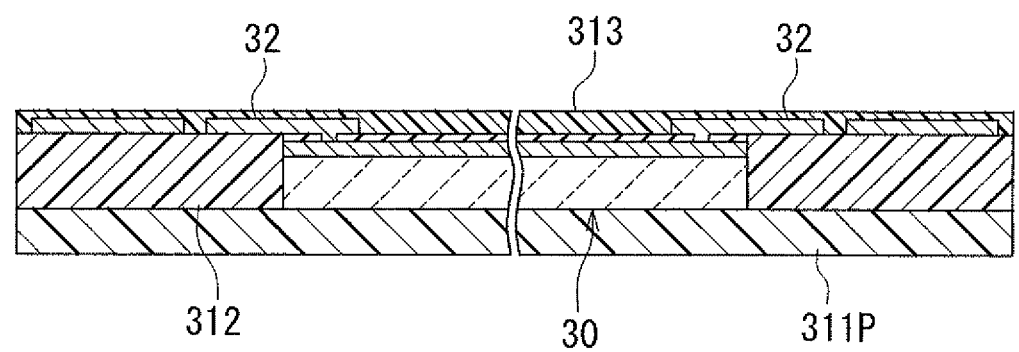
FIG. 29 is a cross-sectional view showing a step that follows the step of FIG. 28.

FIG. 29 is a cross-sectional view showing a step that follows the step of FIG. 28. In this step, an insulating layer 313 is formed to cover the wiring 31 (the plurality of conductors 32), and the top surface of the insulating layer 313 is flattened. The insulating layer 313 is made of resin, for example. Through the series of steps shown in FIG. 26 to FIG. 29, a portion of the initial substructure that corresponds to the lowermost layer portion 10 of the main body 2 is formed.

Figure 30:
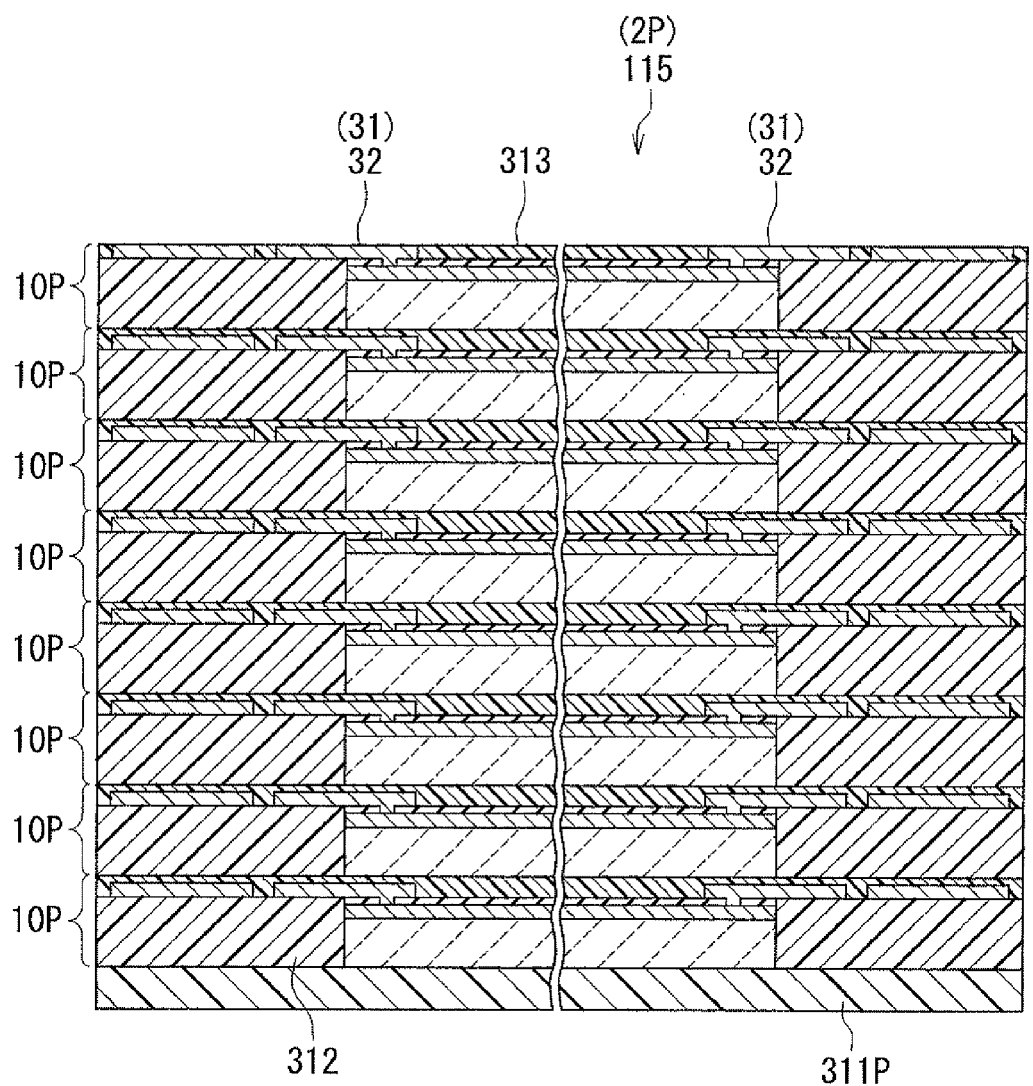
FIG. 30 is a cross-sectional view showing a step that follows the step of FIG. 29.

FIG. 30 is a cross-sectional view showing a step that follows the step of FIG. 29. In this step, a semiconductor chip 30 is initially mounted on the insulating layer 313. This semiconductor chip 30 is to be the semiconductor chip 30 of the second lowest layer portion 10 of the main body 2. When mounting the semiconductor chip 30 on the insulating layer 313, a metal layer may be formed on the insulating layer 313 so that the semiconductor chip 30 is bonded onto the metal layer. Next, an insulating layer 312, wiring 31 (conductors 32), and an insulating layer 313 are formed in the same way as with the series of steps shown in FIG. 27 to FIG. 29. This consequently forms a portion of the initial substructure that corresponds to the second lowest layer portion 10 of the main body 2. Subsequently, the same steps are repeated to form the initial substructure 115. The initial substructure 115 includes a plurality of initial main body portions 2P that are arranged in the directions orthogonal to the stacking direction of the plurality of layer portions 10. Each initial main body portion 2P is to undergo the formation of a plurality of through holes 20 therein later to thereby become a main-body-forming portion.

FIG. 30 shows an initial main body portion 2P. The initial main body portion 2P includes a plurality of stacked initial layer portions 10P which are the plurality of stacked layer portions 10 before the formation of the plurality of through holes 20. Each of the plurality of initial layer portions 10P includes a semiconductor chip 30, and an insulating layer 312 disposed around the semiconductor chip 30. Note that the insulating layer 313 is a component of the initial layer portion 10P that is located directly below.

Figure 31:
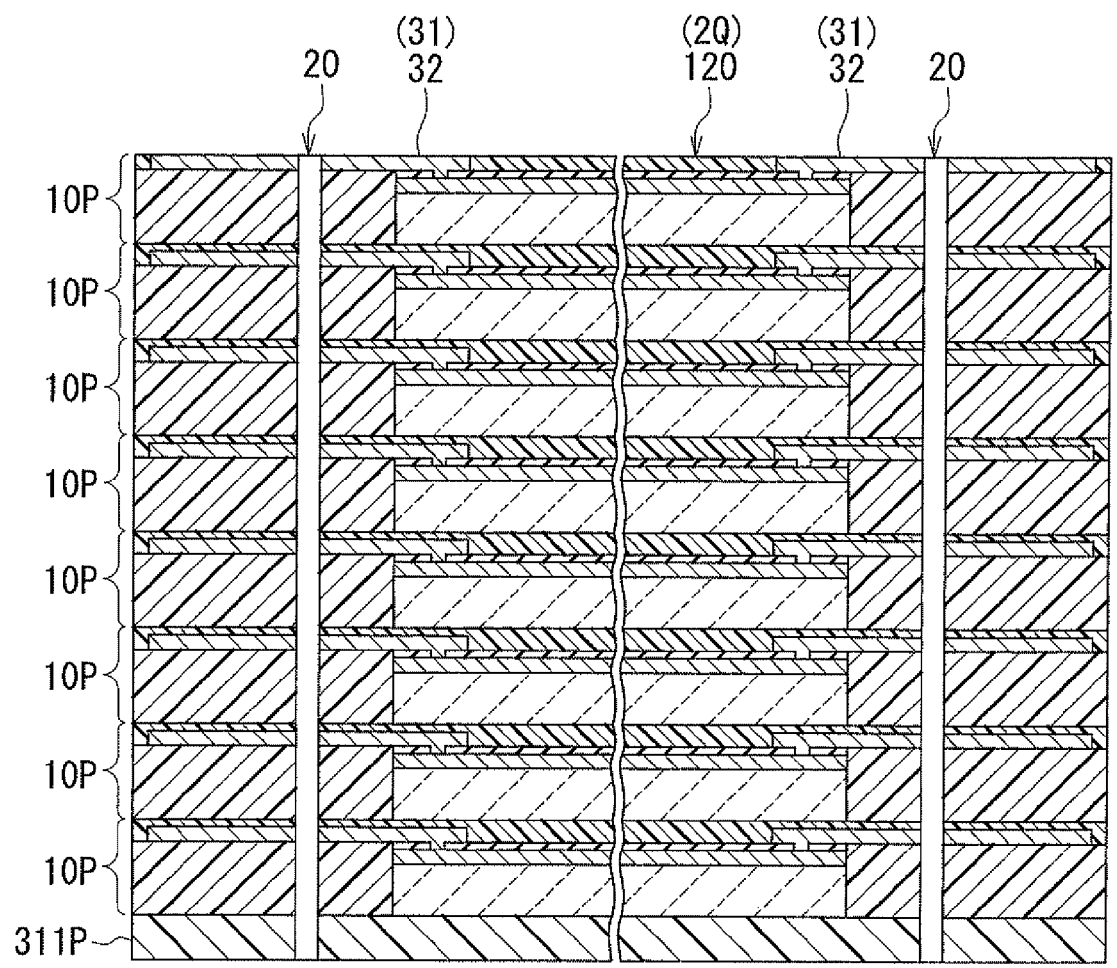
FIG. 31 is a cross-sectional view showing a step that follows the step of FIG. 30.

FIG. 31 is a cross-sectional view showing a step that follows the step of FIG. 30. In this step, a plurality of through holes 20 are formed in each of the plurality of initial main body portions 2P of the initial substructure 115. The initial main body portions 2P are thereby made into main-body-forming portions 2Q, and the initial substructure 115 is made into a substructure 120. The substructure 120 includes a plurality of main-body-forming portions 2Q that are arranged in the directions orthogonal to the stacking direction of the plurality of layer portions 10. FIG. 31 shows a main-body-forming portion 2Q.

In the present embodiment, the plurality of through holes 20 are formed to penetrate the insulating layers 312 of the plurality of initial layer portions 10P. Each single through hole 20 is formed to pass through the electrode pass holes 32a of a plurality of conductors 32 that align in the stacking direction of the plurality of initial layer portions 10P, and to penetrate the substructure 120 (main-body-forming portion 2Q). The plurality of through holes 20 are formed by the same method as in the first embodiment.

Figure 32:
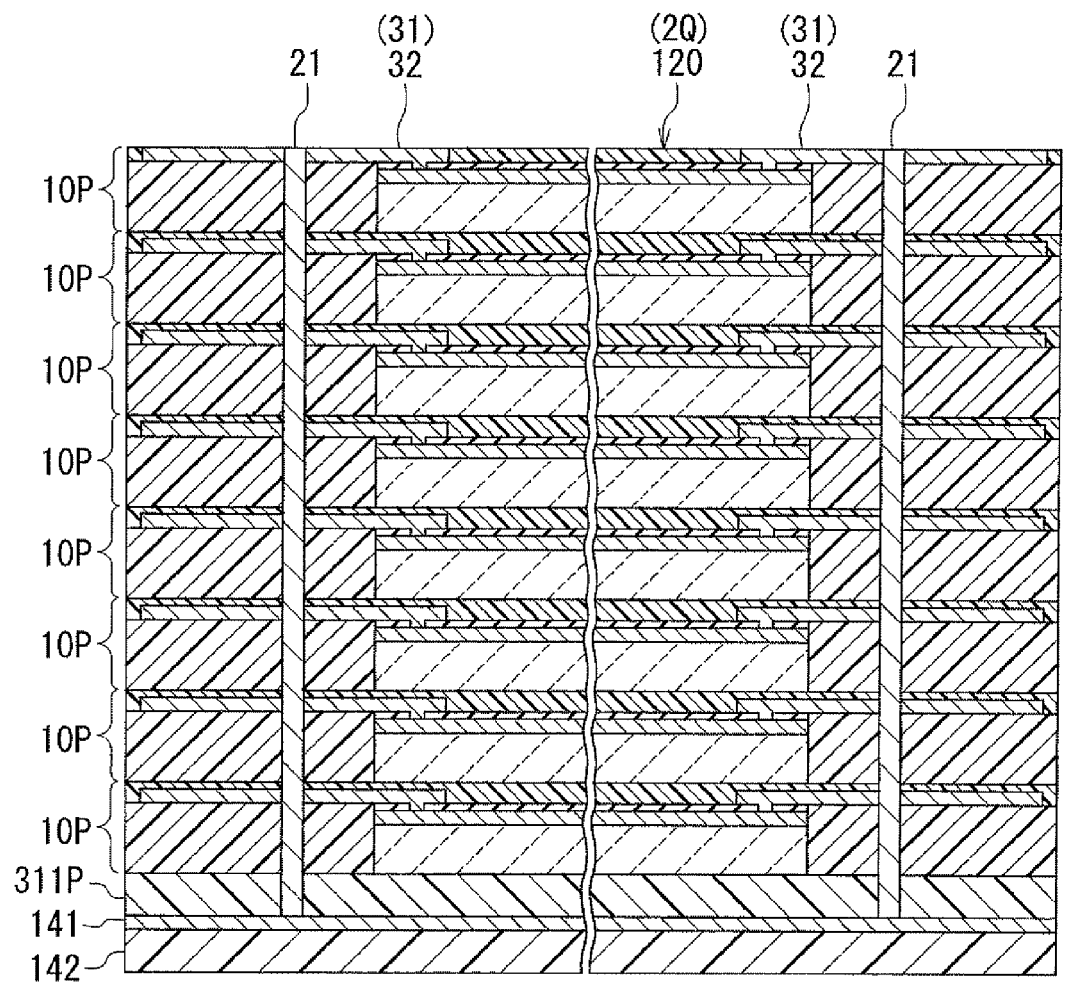
FIG. 32 is a cross-sectional view showing a step that follows the step of FIG. 31.

FIG. 32 is a cross-sectional view showing a step that follows the step of FIG. 31. In this step, a plurality of through electrodes 21 are formed in the plurality of through holes 20. The plurality of through electrodes 21 are formed by the same method as in the first embodiment. When the plurality of through electrodes 21 are formed, the wall faces of the electrode pass holes 32a make contact with the outer surfaces of the through electrodes 21 that pass through the respective electrode pass holes 32a. Consequently, the conductors 32 are electrically connected to the through electrodes 21, and the semiconductor chips 30 and the through electrodes 21 are electrically connected by the wiring 31 including the plurality of conductors 32.

When manufacturing a layered chip package 301 that has a plurality of terminals 5 disposed on the bottom surface 2b of the main body 2, the formation of the plurality of through electrodes 21 is followed by the formation of the plurality of terminals 5. Here, the terminals 5 are formed on the bottom surfaces of the plurality of main-body-forming portions 2Q of the substructure 120 by plating, for example.

In the present embodiment, as in the first embodiment, the substructure 120 is then cut to separate the plurality of main-body-forming portions 2Q from each other into a plurality of main bodies 2. This makes the pre-base portions 311P into bases 311.

In other respects, the configuration, function and effects of the present embodiment are the same as those of the first or second embodiment.

The present invention is not limited to the foregoing embodiments, and various modifications may be made thereto. For example, the initial substructure can be fabricated by other methods than those described in the embodiments. For example, two pre-polishing arrays 109 (see FIG. 10) may be bonded to each other using an adhesive made of an insulating resin, with the respective first surfaces 109a arranged to face each other. Then, the respective second surfaces 109b of the two pre-polishing arrays 109 are polished to form a stack of two chip arrays 110. A plurality of such stacks of two chip arrays 110 can be bonded together to fabricate an initial substructure.

According to the present invention, the method of forming the through electrodes is not limited to plating and may use other techniques. For example, the through holes may initially be filled with a conductive paste that contains silver, copper, or other metal powder and a binder. Then, the conductive paste can be heated to decompose the binder and sinter the metal so that the through electrodes are formed. Alternatively, silver, copper, or other metal powder may initially be pressed into the through holes, and then the metal power can be heated to sinter the metal so that the through electrodes are formed.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A method of manufacturing at least one layered chip package, the at least one layered chip package comprising:
   a main body that includes a plurality of layer portions stacked and a plurality of through holes that penetrate all the plurality of layer portions; and
   a plurality of through electrodes that are provided in the plurality of through holes of the main body and penetrate all the plurality of layer portions, wherein:
   each of the plurality of layer portions includes a semiconductor chip as its principal part; and
   at least one of the plurality of layer portions includes wiring that electrically connects the semiconductor chip to the plurality of through electrodes,
   the method comprising the steps of:
   fabricating a substructure that includes the main body of the at least one layered chip package, the step of fabricating the substructure including the steps of:
   fabricating an initial substructure which will become the substructure after the formation of the plurality of through holes, the initial substructure including a plurality of initial layer portions which will become the plurality of layer portions after the formation of the plurality of through holes, each of the plurality of initial layer portions including the semiconductor chip, a plurality of insulator fill holes and insulating layers, the plurality of insulator fill holes being formed in the semiconductor chip to penetrate the semiconductor chip, the insulating layers being made of an insulator and filling the respective insulator fill holes, and
   forming the plurality of through holes in the initial substructure so that the initial substructure becomes the substructure, the plurality of through holes being formed to penetrate the insulating layers of the plurality of initial layer portions, and
   forming the plurality of through electrodes in the plurality of through holes in the main body of the substructure.

2. The method according to claim 1, wherein
   the at least one layered chip package is a plurality of layered chip packages, and
   the substructure includes main bodies of the plurality of layered chip packages, the main bodies being arranged in a direction orthogonal to a stacking direction of the plurality of layer portions,
   the method further comprising the step of separating the main bodies from each other after the step of forming the plurality of through electrodes.

3. The method according to claim 1, wherein the plurality of through electrodes are formed by plating.

4. The method according to claim 1, wherein:
   the wiring includes a plurality of conductors that are electrically connected to the plurality of through electrodes; and
   the plurality of conductors have their respective end faces that appear in wall faces of the plurality of through holes and make contact with outer surfaces of the through electrodes.

5. The method according to claim 4, wherein the plurality of conductors have their respective electrode pass holes for the plurality of through electrodes to be passed through, and wall faces of the electrode pass holes constitute the end faces.

6. The method according to claim 1, wherein the insulator contains resin as its main component.

7. The method according to claim 6, wherein the insulator further contains insulating grains mixed with the resin.

8. The method according to claim 1, wherein:
   the at least one layered chip package is a plurality of layered chip packages;
   the substructure includes main bodies of the plurality of layered chip packages, the main bodies being arranged in a direction orthogonal to a stacking direction of the plurality of layer portions; and
   the step of fabricating the initial substructure includes the steps of:
   fabricating a plurality of chip arrays, each of the plurality of chip arrays including an array of a plurality of pre-semiconductor-chip portions, each of the plurality of pre-semiconductor-chip portions being intended to become any one of the semiconductor chips included in any one of the main bodies; and
   forming the initial substructure by stacking the plurality of chip arrays,
   the method further comprising the step of separating the main bodies from each other after the step of forming the plurality of through electrodes.

9. The method according to claim 8, wherein the step of fabricating the plurality of chip arrays includes, as a series of steps for fabricating a single chip array, the steps of:
   fabricating a pre-array wafer that has first and second surfaces facing toward opposite directions and includes an array of a plurality of pre-semiconductor-chip portions;
   forming a plurality of grooves in the pre-array wafer, the plurality of grooves opening in the first surface of the pre-array wafer and being intended to become the plurality of insulator fill holes later;
   filling the plurality of grooves with the insulator, thereby forming a pre-polishing array that has first and second surfaces corresponding to the first and second surfaces of the pre-array wafer; and
   polishing the pre-polishing array from its second surface until the plurality of grooves are exposed so that the plurality of grooves become the plurality of insulator fill holes.

10. The method according to claim 8, wherein:
    the plurality of layer portions of at least one of the main bodies include at least one first-type layer portion and at least one second-type layer portion;
    the semiconductor chip of the first-type layer portion is a normally functioning one;
    the semiconductor chip of the second-type layer portion is a malfunctioning one;
    the first-type layer portion includes the wiring, whereas the second-type layer portion does not include the wiring; and
    the step of fabricating the plurality of chip arrays includes the steps of:
    distinguishing the plurality of pre-semiconductor-chip portions into normally functioning pre-semiconductor-chip portions and malfunctioning pre-semiconductor-chip portions; and
    forming the wiring in the normally functioning pre-semiconductor-chip portions, and not in the malfunctioning pre-semiconductor-chip portions.

* * * * *

UNITED STATES PATENT AND TRADEMARK OFFICE
CERTIFICATE OF CORRECTION

PATENT NO. : 8,455,349 B2  
APPLICATION NO. : 12/769361  
DATED : June 4, 2013  
INVENTOR(S) : Yoshitaka Sasaki et al.

Page 1 of 1

It is certified that error appears in the above-identified patent and that said Letters Patent is hereby corrected as shown below:

On the title page (73) Assignees should read: Headway Technologies, Inc., Milpitas, CA (US)

In the Specifications:

Col. 3, line 67 should read "substructure may include the steps of: fabricating a plurality of"
Col. 4, line 13 should read "the steps of: fabricating a pre-array wafer that has first and"
Col. 9, line 23 should read "of: fabricating an initial substructure that is intended to"
Col. 11, line 34 should read "temperature in the range of, for example, 150° C to 250° C,"

Signed and Sealed this
Thirteenth Day of August, 2013

Teresa Stanek Rea
*Acting Director of the United States Patent and Trademark Office*